United States Patent
Furuya et al.

(10) Patent No.: US 8,408,895 B2
(45) Date of Patent: Apr. 2, 2013

(54) TRANSFERRING MOLD AND PRODUCTION PROCESS OF TRANSFERRING MOLD

(75) Inventors: Kazuyuki Furuya, Tokyo (JP); Masaru Suzuki, Tokyo (JP)

(73) Assignee: Asahi Kasei Kabushiki Kaisha, Osaka-Shi (JP)

( * ) Notice: Subject to any disclaimer, the term of this patent is extended or adjusted under 35 U.S.C. 154(b) by 0 days.

(21) Appl. No.: 13/376,044

(22) PCT Filed: Jun. 3, 2010

(86) PCT No.: PCT/JP2010/059420
§ 371 (c)(1),
(2), (4) Date: Feb. 27, 2012

(87) PCT Pub. No.: WO2010/140648
PCT Pub. Date: Dec. 9, 2010

(65) Prior Publication Data
US 2012/0148704 A1    Jun. 14, 2012

(30) Foreign Application Priority Data
Jun. 5, 2009  (JP) .................... 2009-136700

(51) Int. Cl.
*B29C 59/04* (2006.01)
*B29C 33/38* (2006.01)

(52) U.S. Cl. .............. 425/471; 106/38.22; 106/38.25; 106/38.27; 264/219; 264/338; 492/53

(58) Field of Classification Search .......... 425/363–374, 425/385, 471; 264/219, 338; 106/38.22, 106/38.25, 38.27; 492/53, 56
See application file for complete search history.

(56) References Cited

U.S. PATENT DOCUMENTS

| | | | |
|---|---|---|---|
| 2,833,661 A * | 5/1958 | Iler | ............ 106/38.25 |
| 5,259,926 A | 11/1993 | Kuwabara et al. | |
| 5,772,905 A | 6/1998 | Chou | |
| 7,190,387 B2 | 3/2007 | Rinehart et al. | |
| 2006/0087741 A1 | 4/2006 | Shimizu | |
| 2009/0261501 A1* | 10/2009 | Usami | ............ 264/219 |
| 2011/0027408 A1 | 2/2011 | Suzuki et al. | |

FOREIGN PATENT DOCUMENTS

| | | |
|---|---|---|
| JP | 3-26527 A | 2/1991 |
| JP | 2003-251634 A | 9/2003 |

(Continued)

OTHER PUBLICATIONS

International Search Report, dated Sep. 7, 2010 in PCT/JP2010/059420.

(Continued)

*Primary Examiner* — James Mackey
(74) *Attorney, Agent, or Firm* — Birch, Stewart, Kolasch & Birch, LLP

(57) ABSTRACT

To provide a transferring mold by which fine patterns can be transferred and transcription of a large area can be coped with and a production process of the transferring mold. The transferring mold of the present invention is characterized in that the mold comprises a roll body formed approximately in a column shape, a surface layer (3) formed on the outer peripheral surface of the roll body and a fine structure layer formed on the surface layer (3) and that the surface layer (3) is composed of a material having a refractive index n of not less than 1.3 and not more than 2.0 and an extinction coefficient k of not more than 0.3 at a wavelength of 405 nm.

24 Claims, 10 Drawing Sheets

FOREIGN PATENT DOCUMENTS

| | | |
|---|---|---|
| JP | 2005-153223 A | 6/2005 |
| JP | 2005-238719 A | 9/2005 |
| JP | 2006-5022 A | 1/2006 |
| JP | 2006-116826 A | 5/2006 |
| JP | 2007-507725 A | 3/2007 |
| JP | 2007-144995 A | 6/2007 |
| JP | 2007-229996 A | 9/2007 |
| JP | 2007-258419 A | 10/2007 |
| JP | 2009/093700 A1 | 7/2009 |

OTHER PUBLICATIONS

Tan et al., "Roller nanoimprint lithography", J. Vac. Sci. Technol. B 16(6), American Vacuum Society, Nov./Dec. 1998, pp. 3926-3928.

* cited by examiner

TRANSFERRING MOLD AND PRODUCTION PROCESS OF TRANSFERRING MOLD

TECHNICAL FIELD

The present invention relates to a transferring mold suitable for a roll-shaped mold to transfer a fine structure.

BACKGROUND ART

Conventionally, as a method of imparting nanoimprint, optical element or the like with a fine shape, such a method has been formed that the shape is transferred to a glass substrate, plastic substrate, plastic film, etc. using a mold with the fine shape formed beforehand therein (Patent Documents 1 and 2).

Among these techniques are a method of pressing a mold (also referred to as a die or a template) that is an original plate with a pattern of fine grooves, holes, etc. formed therein against a transfer target material and thereby transferring the pattern mechanically, another method of transferring using a thermoplastic resin, still another method of optically transferring using a photo-curing resin, etc. (Patent Document 3). The resolution of the pattern in these methods is determined by fabrication accuracy of the mold. In other words, once the mold is prepared, it is possible to form the fine structure with an inexpensive apparatus. As the mold that is the original plate, known generally are a parallel flat-plate type mold (referred to as a wafer or plate) and a cylindrical (roller) type mold, from their shapes (Patent Document 4, Non-patent Document 1).

As a production process of the parallel flat-plate type mold, there are a method using a semiconductor lithography technique by applying an ultraviolet photo resist, electron beam resist, X-ray resist or the like onto a substrate, then irradiating and exposing the substrate with/to ultraviolet light, electron beams, X-rays or the like to fabricate an original plate of a preferred pattern, and another method of fabricating an original plate through a mask (reticle) with a pattern beforehand rendered therein (Patent Document 5)

Theses methods are very effective methods for forming an extremely fine pattern of about 100 nm on a flat plate. However, since a photoresist using photoreaction is used, it is necessary to expose using a spot smaller than the pattern required in principle so as to form a fine pattern. Accordingly, since a KrF or ArF laser, etc. with short wavelengths is used as an exposure light source, the exposure apparatus is large and the complicated mechanism is required. Further, in the case of using an exposure light source of electron beam, X-ray or the like, since a vacuum is required as an exposure atmosphere, it is necessary to place the original plate in a vacuum chamber. Therefore, it is significantly difficult to increase the original plate size. Meanwhile, to fabricate a large-area mold using these methods, considered is a method of using a step-and-repeat function for connecting small exposure areas to fabricate, but there is a problem in the connection accuracy between patterns (Patent Document 6).

Meanwhile, as a method of fabricating a cylindrical (roller) type mold, two methods have conventionally been adopted. First, there is a method of fabricating a parallel flat-plate original plate once, transferring the shape by electroforming comprised of a thin foil made of nickel or the like, and winding the thin foil around a roller (Patent Document 7). Another method (seamless roller mold) is a fabricating method of directly rendering a mold pattern on a roller by laser processing or mechanical processing (Non-patent Document 2). In the former method, it is necessary to wind a nickel thin-foil mold with an area larger than the area to manufacture, and there is another problem that a seam arises in the winding portion. Meanwhile, in the latter method, once the mold is fabricated, the mold is high in productivity and excellent in volume production, but it is significantly difficult to form a pattern of the submicron (less than 1 μm) size using laser processing or mechanical processing.

CITATION List

Patent Literature

[Patent Literature 1] Specification of U.S. Pat. No. 5,259,926
[Patent Literature 2] Specification of U.S. Pat. No. 5,772,905
[Patent Literature 3] Japanese Patent Laid-Open No. 2005-238719
[Patent Literature 4] Japanese Patent Laid-Open No. 2006-5022
[Patent Literature 5] Japanese Patent Laid-Open No. 2007-144995
[Patent Literature 6] Japanese Patent Laid-Open No. 2007-258419
[Patent Literature 7] Japanese Patent Laid-Open No. 2007-507725

Non-Patent Literature

[Non-Patent Literature 1] Hua Tan, Andrew Gibertson, Stephen Y. Chou, "Roller nanoimprint lithography" J. Vac. Sci. Technol. B16(6), 3926 (1998)
[Non-Patent Literature 2] "Nanoimprint application casebook" P.611-P.612 published by JOHOKIKO Co., Ltd.

SUMMARY OF THE INVENTION

Technical Problem

The present invention has been made in consideration of these points, and an object of the invention is to provide a transferring mold which can transfer a fine pattern and can cope with the transcription of a large area as well as a production process of a transferring mold

Solution to the Problem

The transferring mold of the present invention is characterized in that the mold comprises a roll body formed approximately in a column shape, a surface layer formed on the outer peripheral surface of the roll body and a fine structure layer formed on the surface layer and that the surface layer is composed of a material having a refractive index n of not less than 1.3 and not more than 2.0 and an extinction coefficient k of not more than 0.3 at a wavelength of 405 nm.

In the transferring mold of the present invention, it is preferable that the surface layer is composed of an inorganic material having a refractive index n of not less than 1.3 and not more than 2.0 and an extinction coefficient k of not more than 0.3 at a wavelength of 405 nm.

In the transferring mold of the present invention, it is preferable that the inorganic material is selected from a group consisting of oxides, nitrides, carbides, sulfides and fluorides of an element of Group I to Group VI and Group XII to Group XVI in the periodic table and a mixture thereof.

In the transferring mold of the present invention, it is preferable that the inorganic material is a glass material.

In the transferring mold of the present invention, it is preferable that the glass material is selected from a group consisting of quartz glass, high silica glass, borosilicate glass, amino silica glass, alkali-free glass, lead glass, barium glass, phosphosilicate glass, fluoride glass, lanthanum glass, transparent crystallized glass ceramics and heat-absorbing glass.

In the transferring mold of the present invention, it is preferable that the surface layer is composed of an organic material having a refractive index n of not less than 1.3 and not more than 2.0 and an extinction coefficient k of not more than 0.3 at a wavelength of 405 nm.

In the transferring mold of the present invention, it is preferable that the organic material is selected from polypropylene, polyester, polyethylene terephthalate, polyethylenenaphthalate, polyphenylene sulfide, polyethersulfone, polyimide, polycarbonate, polymethylene methacrylate, acrylate, polyvinyl alcohol, polyamide, aramid, fluororesin, polyolefin, silicone resin, epoxy resin, amide-imide resin, maleimide resin, cellulosic resin, and liquid crystal polymer.

In the transferring mold of the present invention, it is preferable that the thickness of the surface layer is in not less than 5 μm and not more than 10 mm.

In the transferring mold of the present invention, it is preferable that arithmetic average roughness Ra as a surface roughness of the surface layer is not more than 10 nm.

In the transferring mold of the present invention, it is preferable that the surface layer is composed of at least two laminated layers of materials having a refractive index n of not less than 1.3 and not more than 2.0 and an extinction coefficient k of not more than 0.3 at a wavelength of 405 nm and that a light-absorbing layer is formed between the roll body and the surface layer in contact with the roll body.

In the transferring mold of the present invention, it is preferable that the roll body is a roll body having electric conductivity.

In the transferring mold of the present invention, it is preferable that the roll body is a roll body having electric conductivity composed of a material selected from a group consisting of SUS, carbon steel, Al, Al alloy, Ti, Ti alloy, carbon fiber composite, electrically conductive plastic material and these combinations.

In the transferring mold of the present invention, it is preferable that the roll body has an electric conductivity composed of a material having an electrical resistivity of not more than $10^{10}$ Ω·cm In the transferring mold of the present invention, it is preferable that the difference of the thermal linear expansion coefficient at respective room temperatures between the roll body and the surface layer formed on the outer peripheral surface of the roll body is not more than $20 \times 10^{-6}$/° C.

In the transferring mold of the present invention, it is preferable that the roll body is composed of a material having a thermal linear expansion coefficient of not more than $15 \times 10^{-6}$/° C.

In the transferring mold of the present invention, it is preferable that the fine structure layer is composed of a photo resist material.

In the transferring mold of the present invention, it is preferable that the fine structure layer is composed of a heat reaction type resist material.

In the transferring mold of the present invention, it is preferable that the heat reaction type resist material is an organic resist material or an inorganic resist material.

In the transferring mold of the present invention, it is preferable that the heat reaction type resist materials are selected from a group consisting of incomplete oxides, pyrolytic oxides and metal alloys.

In the transferring mold of the present invention, it is preferable that the fine structure layer is composed of at least two layers of laminated heat reaction type resist materials.

In the transferring mold of the present invention, it is preferable that the fine structure layer is composed of a material selected from a group consisting of Si, oxides of Si, nitrides of Si, carbides of Si, Ta, oxides of Ta, nitrides of Ta and carbides of Ta.

In the transferring mold of the present invention, it is preferable that aheat absorption layer is formed on the upper or lower side of the fine structure layer.

Production process of the transferring mold of the present invention is characterized in that the process comprises a step of forming a roll body used for the transferring mold and a layer composed of a resist material on the surface layer which is formed on the outer peripheral surface of the roll body and a step of forming a fine structure by irradiating laser on the layer composed of a resist material.

It is preferable that the production process of the transferring mold of the present invention comprises a step of forming a roll body used for the transferring mold and a layer composed of an etching material selected from a group consisting of Si, oxides of Si, nitrides of Si, carbides of Si, Ta, oxides of Ta, nitrides of Ta and carbides of Ta on the surface layer which is formed on the outer peripheral surface of the roll body, a step of forming a layer composed of a resist material on the layer composed of an etching material, a step of forming a fine structure by irradiating laser on the layer composed of a resist material, a step of etching the layer composed of an etching material and a step of removing the layer composed of a resist material on which the fine structure has been formed.

Technical Advantage of the Invention

According to the present invention, fine patterns can be transferred and transcription of a large area can be coped with. In addition, according to the present invention, degrees of freedom of uneven shape are high and aspect ratio of the fine structure can be controlled freely.

DESCRIPTION OF EMBODIMENTS

In the following, embodiments of the present invention are described in detail referring to attached drawings.

Various processes are usually mentioned as preparation processes of a roll-shaped mold and the roll body according to the present invention is suitable for a process in an embodiment in which an exposure is performed by focusing a laser beam on the surface of the roll body. The following various embodiments can be mentioned as specific examples.

Figure 1:
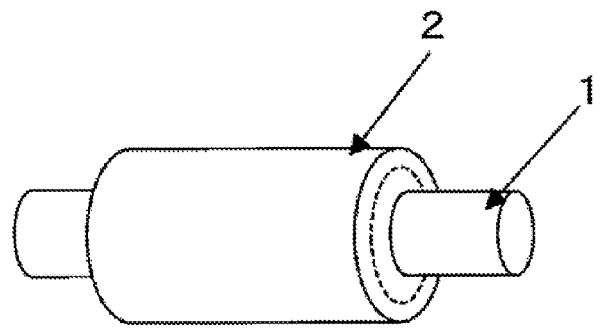
FIG. 1 is a drawing illustrating a form of a common roll body.
Figure 2:
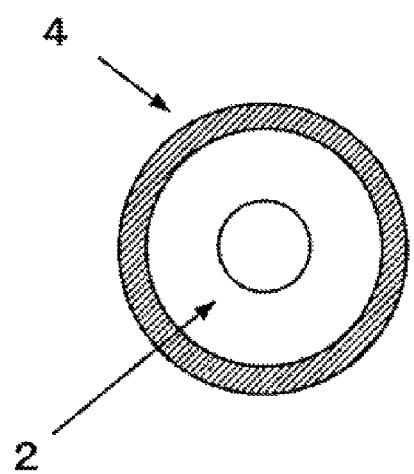
FIG. 2 is a drawing illustrating a cross section structure of a common roll body.

Typically, a roll takes an embodiment of being combined with a sleeve 2 having a shaft 1 which holds and allows the roll to turn as shown in FIG. 1.
A resist layer 4 is formed on the roll surface. Construction viewed as a roll section is illustrated in FIG. 2. Patterns are formed on the roll surface by exposing a surface resist with light from the outside.

As methods for forming patterns, there is a method to expose with a mask on which patterns are formed beforehand and a method to draw patterns with a focused laser beam or the like directly on the roll surface.
The former method is a method widely used in semiconductor industry and so on, but when forming patterns on a curved surface of a roll, it is difficult to focus uniformly on the entire irradiation surface and thus it is difficult to form fine patterns. On the other hand, although the drawing time is elongated since patterns are drawn directly on the roll surface in the latter method, finer patterns than the method using a mask can be formed.

In the method to directly draw patterns with a laser beam on the resist formed on the roll surface, processing working accuracy of the roll body becomes very important since it is necessary to focus the laser beam on the resist surface. Therefore, metallic materials, for example, Al or stainless steels and so on which are usually easy to work and accuracy is easy to be attained have been used as a roll body, namely, a sleeve and a shaft. In addition, a method has been adopted to use a stainless steel for the shaft while using a carbon fiber compact for the sleeve on which Cr is plated so as to weight saving the roll body.

However, since a metallic material is easy to reflect light, the light which has penetrated the resist reflects on the roll body during exposure of the resist, and thus there is caused a problem that exposure characteristics largely change due to the interference of the incident light and the reflected light. So, fine patterns cannot be formed precisely by such a method.

Under the circumstances, the present inventors put their attention on materials which constituted the roll body and conducted intensive studies and consequently found that undergo change of exposure characteristics of the resist were able to be improved and fine patterns were able to be precisely formed by specifying the optics characteristics of the materials which constituted the roll body. In addition, since fine patterns can be formed in this transferring mold, the degree of freedom in the concavo-convex form is high, and the aspect ratio of the fine structure can be controlled freely.

In the following, embodiments of the present invention are described in detail referring to the attached drawings.

The transferring mold according to the present invention comprises a roll body formed approximately in a column shape, a surface layer formed on the outer peripheral surface of the roll body and a fine structure layer formed on the surface layer wherein the surface layer is composed of a material having a refractive index n of not less than 1.3 and not more than 2.0 and an extinction coefficient k of not less than 0 and not more than 0.3 at a wavelength of 405 nm.

Here, the fine structure layer refers to as a layer where a fine structure is formed, and the fine structure layer may be composed of a resist layer or an etching layer independently or the fine structure layer may be composed of a resist layer and an etching layer in the layer construction mentioned later.

Figure 3:
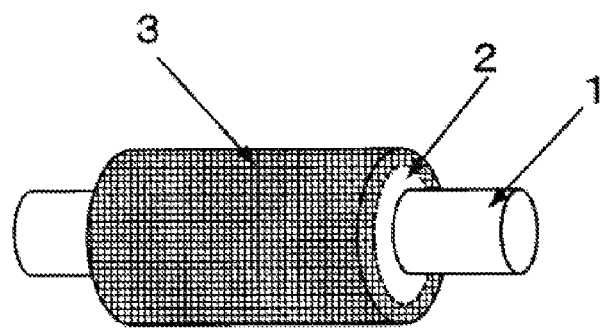
FIG. 3 is a drawing illustrating a form of a roll body according to an embodiment of the present invention.

An example of the structure of the roll body according to the present invention is illustrated in FIG. 3. The roll body according to the present embodiment comprises a shaft 1 formed approximately in a column shape, a sleeve 2 formed on the outer peripheral surface of the shaft 1. A surface layer 3 is laminated on the outer peripheral surface of the sleeve 2 of this roll body.

Figure 4:
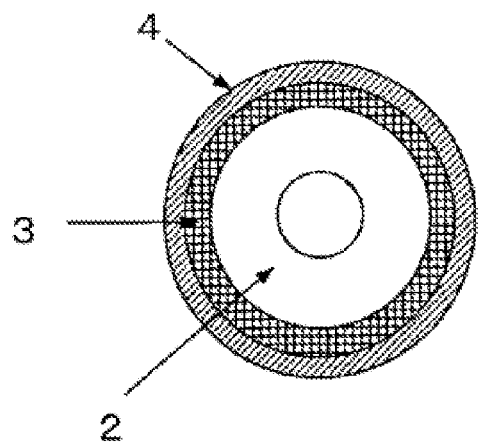
FIG. 4 is a drawing illustrating a cross section structure of a roll body according to an embodiment of the present invention.

And the roll body is constructed by forming a resist layer 4 on the surface layer 3 of the roll body as shown in FIG. 4. In the roll body according to the present invention, the exposure light can be prevented from reflecting on the outer-most surface of the roll body since the surface layer 3 of the roll body is a material having the above optical constants to provide stable exposure characteristics.

In the roll body according to the present embodiment, the surface layer may be formed heterogeneously if the material has a refractive index n of not less than 1.3 and not more than 2.0 and an extinction coefficient k of not less than 0 and not more than 0.3 at a wavelength of 405 nm when the light is incident on the surface of the roll body. Here, construction to laminate a surface layer 3 on a roll body is adopted in the present embodiment, it may be incorporated with the sleeve 2, for example, by constituting the material close to the outer peripheral surface of the sleeve 2 as a material having the above optical constants and so on.

The thickness of the surface layer is preferably not less than 5 μm and not more than 10 mm, more preferably not less than 100 μm and not more than 10 mm, still more preferably not less than 500 μm and not more than 7 mm in consideration of the conditions that the thickness should be sufficiently larger than the wavelength of the light to expose and it should be an etchable film thickness.

The present inventors inspected the effects mentioned above in the following conditions. After a resist was formed on a roll body, alight having an amount lower than the minimum light amount (threshold) for exposure was irradiated on the roll and the light reflected (optical feedback amount) on and come back from the resist surface was detected to estimate the influence on the exposure characteristics. That is, if the light reflected on and come back from the resist surface is assumed as optical feedback amount R and the light amount transmitting through the resist is assumed as transmitting light amount T, light amount A absorbed by the resist is represented by the following Formula (I). Here, the absorption light amount A by the resist typically depend on the optical feedback amount R, since the transmitting light amount T of the resist is typically very small. That is, the influence on the exposure characteristics can be estimated by detecting the optical feedback amount R which has reflected on and returned from the resist surface.

$$A=100-R-T \quad (1)$$

Figure 5:
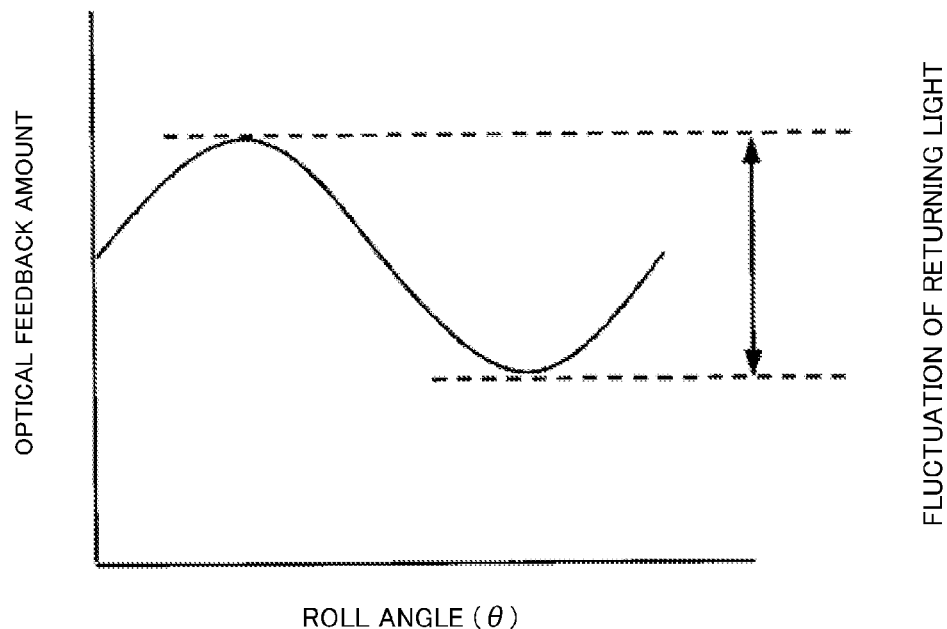
FIG. 5 is a drawing illustrating a change of the optical feedback amount when a roll body according to an embodiment of the present invention is turned.
Figure 6:
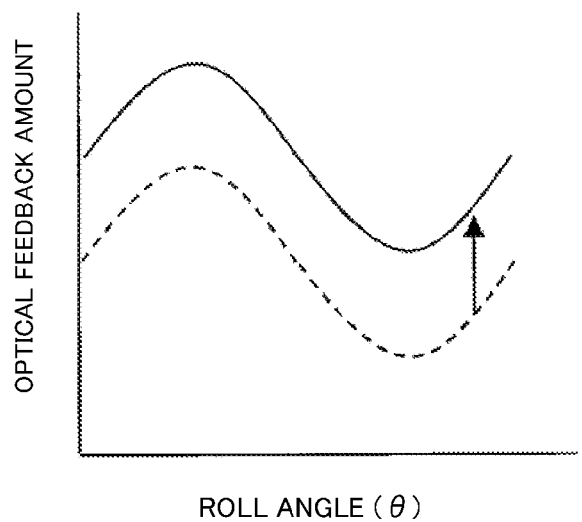
FIG. 6 is a drawing illustrating a change of the optical feedback amount when a roll body according to an embodiment of the present invention but belonging to another lot is turned.

For example, a light having an amount lower than the threshold was irradiated on the roll while rotating the roll, and the optical feedback amount R per one turn of the roll is monitored. If the optical feedback amount R goes up and down within one turn of the roll as shown in FIG. 5, the influence on exposure characteristics can be estimated by large/small amount of the fluctuation of the optical feedback amount. In addition, absolute value of the optical feedback amount R allows to judge the influence on the optimum exposure light amount as shown in FIG. 6.

When optical constants are expressed by refraction index n and extinction coefficient k, at least three following factors: 1) fluctuation of the resist film thickness around the roll; 2) fluctuation among lots in the resist film thickness; and 3) influence on exposure characteristics due to fluctuation of the film thickness of the etching layer provided under the resist layer can be significantly reduced by using a material having a refractive index n of not less than 1.3 and not more than 2.0 and an extinction coefficient k of not more than 0.3 as the optical constants of the outer-most surface of the roll body. These three factors are reduced by the fact that the reflected light from the etching layer or the resist layer and the reflected light from the roll main body do not interfere.

How much fluctuation of the optical feedback R mentioned above is permitted varies depending on the kind of the resist to apply and precision of the fine structure to aim at, but it is preferable that the difference of the maximum and the minimum of optical feedback amount R due to the film thickness fluctuation is not more than 12% and more preferably not more than 10%, and still more preferably not more than 7%.

It is preferable that the material having a refractive index n of not less than 1.3 and not more than 2.0 and an extinction coefficient k of not less than 0 and not more than 0.3 at a wavelength of 405 nm according to the present invention is an inorganic material. The inorganic material is generally uneasy in working but is advantageous in 1) that it is highly hard and strongly resistive to abrasion; 2) that it is highly rigid; 3) that smooth surface roughness is easy to attain; and 4) that it is not easily denatured by acids and alkalis, organic solvents and so on.

As the inorganic material which is suitable for the present invention, oxides, nitrides, carbides, sulfides and fluorides of an element of Group I to Group VI and Group XII to Group XVI in the periodic table and a mixture thereof can be mentioned.

Particularly, in consideration of optical characteristics, hardness and surface smoothness, specifically, oxides, nitrides, carbides, sulfides and fluorides of Li, Be, B, Na, Mg, Al, Si, P, K, Ca, Ti, V, Zn, Ge, As, Rb, Sr, Y, Zr, Nb, Mo, Cd, In, Sn, Sb, Te, Cs, Ba, Hf, Ta, W or lanthanoid elements La, Ce or the mixtures thereof are preferable.

Furthermore, it is more preferable that the inorganic material is a glass material in consideration of workability, durability and availability. Among glass materials, quartz glass, high silicate glass (Pyrex (registered trademark), Vycor glass, etc.), borosilicate glass (crown glass, flint glass, etc.), aminosilicate glass, alkali-free glass, lead glass, barium glass, phosphosilicate glass, fluoride glass, lanthanum glass, transparent crystallized glass ceramics, heat-absorbing glass are suitable. Since these glass materials are different in hardness, rigidness or workable characteristics, they may be selected depending on the purpose to make much of.

Quartz glass and high silicate glass, borosilicate glass are particularly preferable from the viewpoint of optical characteristics and strength.

In the meantime, the material having a refractive index n of not less than 1.3 and not more than 2.0 and an extinction coefficient k of not less than 0 and not more than 0.3 at a wavelength of 405 nm according to the present invention may be an organic material. The organic material is generally difficult in obtaining smooth surface roughness and has characteristics to dissolve or swell in specific organic solvents but it is advantageous in 1) that it is light weight as compared with inorganic materials; 2) that it is easy to work; and 3) that it is inexpensive.

The organic materials which are suitable for the present invention can be selected depending on the characteristics/purposes from polypropylene, polyester, polyethylene terephthalate, polyethylene naphthalate (PEN), polyphenylene sulfide, polyethersulfone, polyimide, polycarbonate, polymethylene methacrylate, polyacrylate, polyvinyl alcohol, polyamide, aramid, fluororesin, polyolefin, silicone resin, epoxy resin, amide-imide resin, maleimide resin, cellulosic resin, liquid crystal polymer appropriately. For example, polymethylene methacrylate or the like is preferable if the transparency is made much of and polycarbonate, PEN and like are suitable if heat resistance and moisture absorption characteristics are made much of.

The surface material of the roll body according to the present invention does not have to be completely colorless and transparent in the wavelength band used for exposure regardless of whether it is an inorganic material or an organic material, and it may be colored as far as it satisfies the condition of having a refractive index n of not more than 2.0 and an extinction coefficient k of not more than 0.3.

Various kinds of metal ions and oxides, nitrides, sulfides are added in order that the surface material of the roll body is colored in the case of an inorganic material. For example, absorption within a specific wavelength band can be imparted by adding transition metal oxides of Cr, Mn, Fe, Co, Ni, Cu, etc. and metal ions, oxides, nitrides, sulfides of Ag, Sn or rare earth elements, La, Ce, Pr, Nd, Sm, Gd, Tb, Dy, Ho, Tm, Yb, Lu, Th, and U, or the mixtures thereof.

On the other hand, in the case wherein the surface material of the roll body is an organic material, materials used in the inorganic material mentioned above can be used and it can be also colored by adding various kinds of organic pigments. Specifically, quinacridone pigments, anthraquinone pigments, polyazo pigments, benzimidazolone pigments, copper phthalocyanine blue, copper phthalocyanine green, soluble azo pigments and insoluble azo pigments such as disazo pigments and monoazo pigments can be mentioned.

The surface roughness of the outer-most surface of the roll body according to the present invention was measured as arithmetic average roughness Ra prescribed in JIS0601-2001. The arithmetic average roughness Ra of the outer-most surface of the roll body is preferably more than zero and not more than 10 nm. More preferably, the upper limit of Ra is not more than 5 nm, still more preferably Ra is not more than 2 nm. The appropriate arithmetic average roughness is almost dependent on the size of a fine structure formed on the surface of the roll body. It depends on the application as the purpose, but around 1/100 of the fine structure size is preferable in consideration that Ra generally influences the fine structure. For example, when the fine structure size is not more than 1 µm, Ra of the roll body is preferably not more than 10 nm, and when the fine structure size is 500 nm, Ra is preferably not more than 5 nm.

Figure 7:
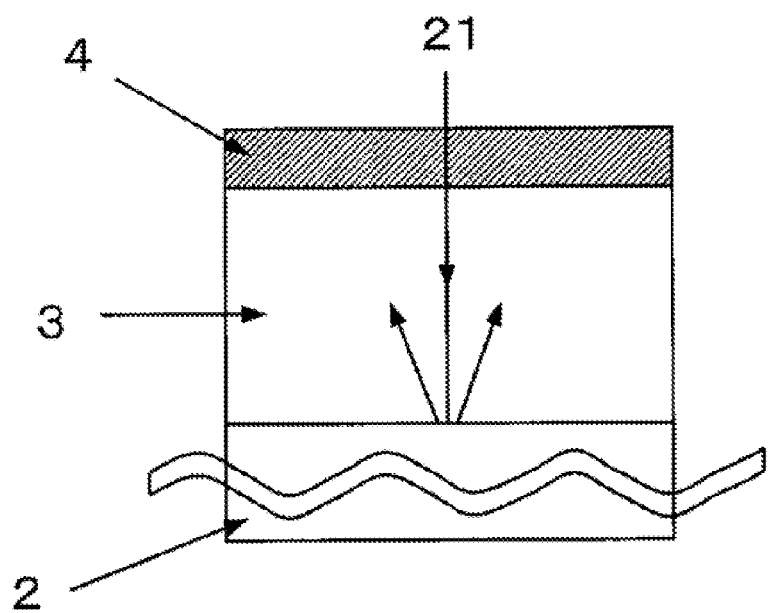
FIG. 7 is a drawing illustrating a reflection state of the exposure laser beam when the thickness of the roll surface layer according to an embodiment of the present invention is thick.
Figure 8:
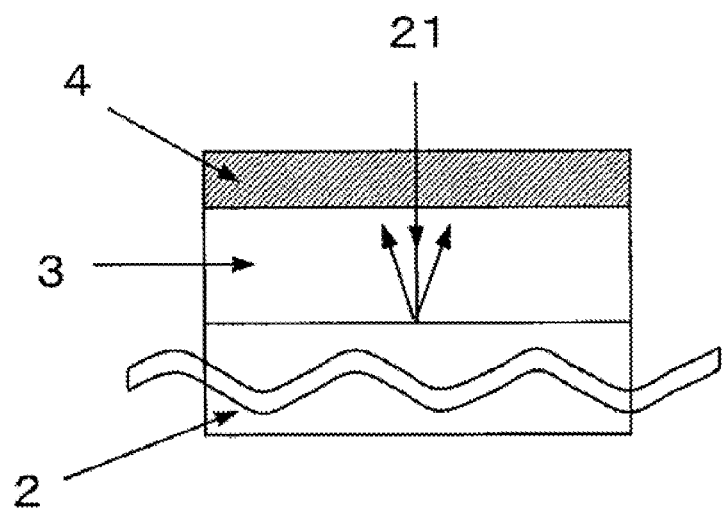
FIG. 8 is a drawing illustrating a reflection state of the exposure laser beam when the thickness of the roll surface layer according to an embodiment of the present invention is thin.
Figure 9:
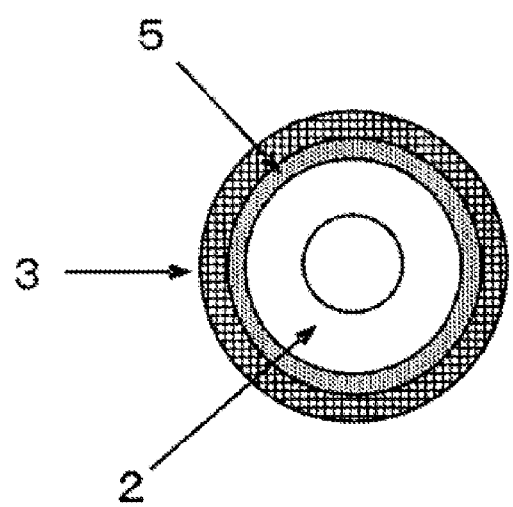
FIG. 9 is a drawing illustrating a sectional structure of the roll body provided with a light-absorbing layer according to an embodiment of the present invention.

As a construction of the transferring mold according to the present invention, the surface layer is composed of materials having a refractive index n of not less than 1.3 and not more than 2.0 and an extinction coefficient k of not less than 0 and not more than 0.3 at a wavelength of 405 nm which are laminated in at least two layers, and, besides a light-absorbing layer is formed between the roll body and the surface layer to contact with the roll body. If the thickness of the surface layer 3 is thicker, the reflected light is scattered in the interface between the surface layer 3 and the sleeve 2 as shown in FIG. 7 and it does not have influence on the exposure to the resist layer 4. On the other hand, when the thickness of the surface layer 3 is thinner, preferred is a construction to provide a light-absorbing layer 5 between the surface layer 3 and the sleeve 2 as shown in FIG. 9 so as to reduce an influence of the reflected light in the interface between the surface layer 3 and the sleeve 2 as shown in FIG. 8.

The material of the light absorbing layer 5 is not particularly limited as far as it has absorption within the exposure wavelength and C (carbon) and a transition metal or oxides, nitrides, sulfide materials thereof and the mixture of these materials or organic adhesive materials which use these materials as a filler may be used.
Particularly, materials with electric conductivity are more preferable.
For example, metals with light absorbency, carbon fibers, materials composed of a mixture of fillers are preferable. In addition, in a construction having a metal sleeve inside the surface layer 3, light absorption may be performed by imparting roughness on the metal sleeve surface so as to assist the bend strength of the roll as shown in FIG. 9. For example, when an Al (aluminum) sleeve is used, a construction to perform light absorption by subjecting the Al sleeve surface to alumite treatment to blacken the surface can be mentioned.

Figure 10:
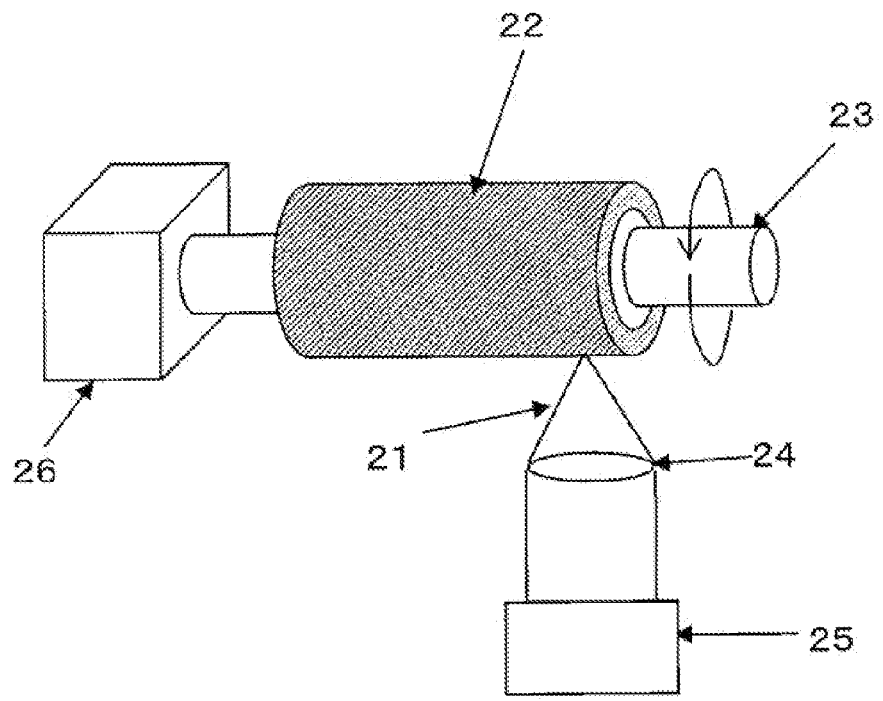
FIG. 10 is a drawing illustrating an apparatus for measurement of reflectance and exposure of the roll body according to an embodiment of the present invention.

Photoresist materials can be used to form a fine structure layer formed on the surface of the roll body in a transferring mold according to the present invention. Positional relation of the photo resist and the roll body are shown in FIG. 10. Photo resist 22 is formed on the outer surface of the roll body 23.

Generally, as a method to form a photo resist 22 on the roll body 23, the former is often formed by coating with a roll coater or the like.
However, when a resist is applied with a roll coater, fluctuation in the thickness is easy to occur within the turn of a roll due to the viscosity of the resist (reference; Japanese Journal of Applied Physics Vol. 43 No. 6B, 2004, pp. 4031-4035 Yuuki Joshima et. al.). In the case wherein the resist film thickness fluctuates within the turn of a roll as mentioned above, the transferring mold according to the present embodiment is very effective.

Photo resist 22 is exposed by laser beam 21 from the surface as shown in FIG. 10. As the exposure method, so-called direct drawing method in which the photo resist 22 is irradiated with a direct laser beam may be adopted or a mask on which a fine structure has been drawn beforehand may be formed, and either method can be used for the transferring mold according to the present embodiment.

As the organic resist which is suitable for the present invention, novolac resin and a mixture of novolac resin and diazo naphthoquin, methacrylate resin, polystyrene resin, polyethylene resin, phenolic resin, polyimide resin, polyamide resin, silicone resin, polyester resin, epoxy resin, melamine resin, vinyl resin and the like can be mentioned as described in "Saishin resist material handbook" ("Handbook of the latest resist materials") published by JOHOKIKO Co., Ltd. and "Photopolymer handbook" published by Kogyo Chosakai Publishing Co., Ltd.

On the other hand, in a transferring mold according to the present invention, heat reaction type resist materials can be used for the fine structure layer formed on the surface of the roll body.

The heat reaction type resist is a resist using materials reacting by the heat of a laser beam. Since the heat reaction type resist has characteristics to react at a predetermined temperature or more, if the materials are selected for the purpose, exposure at a size of less than the spot diameter of the laser, namely less than the optical limit, in laser direct drawing method is possible and thus suitable for forming a fine structure. It is preferable that the heat reaction type resist materials suitable for the present invention are organic resist materials or inorganic resist materials.

The organic resist, which can be applied with a roll coater and the like when formed onto the sleeve, has an advantage to be simple and easy in the process step. A photo resist has characteristics that the pitch of the fine structure can be more easily narrowed than a heat reaction type resist. This is because the photo resist reacts by light.

On the other hand, when heat reaction type resist materials are inorganic resist materials, it is more preferable that they are either one of incomplete oxides, pyrolytic oxides and metal alloys.
Since the heat reaction type resist using an inorganic material such as metal or an oxide has very stable chemical/physical properties in a room temperature state and higher thermal electric conductivity as compared with organic materials, it is more suitable to form a fine structure with a narrowed pitch.

The inorganic heat reaction type resist materials which are suitable for the present invention can be selected by temperature to react in various ways.
For example, Al, Si, P, Ni, Cu, Zn, Ga, Ge, As, Se, In, Sn, Sb, Te, Pb, Bi, Ag, Au and the alloys thereof can be mentioned. In addition, oxides, nitrides, oxynitrides, carbides, sulfides, sulfates, fluorides, chlorides of Mg, Al, Si, Ca, Ti, V, Cr, Mn, Fe, Co, Ni, Cu, Zn, Ga, Ge, As, Se, Sr, Y, Zr, Nb, Mo, Pd, Ag, In, Sn, Sb, Te, Ba, Hf, Ta, W, Pt, Au, Pb, Bi, La, Ce, Sm, Gd, Tb, Dy and the mixtures thereof can be used.

When an incomplete oxide is used as a heat reaction type resist material in the present invention, CrOx, NbOx, TaOx, TiOx, SnOx, PbOx are preferable.

When a pyrolytic oxide is used as a heat reaction type resist material in the present invention, a material having good heat gamma characteristics is selected and specifically, CuO, $Co_3O_4$, $MnO_2$, $Mn_2O_3$, $CrO_3$, $Cr_5O_{12}$, $PbO_2$, $Pb_3O_4$, $TaO_2$, $MgO_2$, $CaO_2$, $BaO_2$, $ZnO_2$ can be mentioned, preferably CuO, $Co_3O_4$, $MnO_2$, $Mn_2O_3$, $CrO_3$, $Cr_5O_{12}$, $PbO_2$, $Pb_3O_4$, $MgO_2$, $CaO_2$, $BaO_2$, $ZnO_2$, more preferably CuO, $Co_3O_4$, $MnO_2$, $Mn_2O_3$, $CrO_3$, $Pb_3O_4$, $BaO_2$. These materials have very excellent heat gamma characteristics. As for the degree of oxidation of the materials, materials are included in the category of heat reaction type resist materials according to the present invention as far as they are in a condition to decompose by laser exposure as stated above.

When a metal alloy is used as a heat reaction type resist material in the present invention, Bi—Te, Sb—Te, In—Sn, Ni—Sn, Al—Sn, Ag—Zn, Bi—Sn, Al—Ni, Pb—Te, Ni—Bi, Bi—Te, Sn—Pb, Sn—Sb, In—Sn, Ni—Sn, Al—Sn, Ag—Zn, Bi—Sn, Al—Ni, Ga—Sb, Ge—Sb, In—Sb, Zn—Te, Zn—Sb are preferable.

Pyrolytic oxides are particularly preferable for heat reaction type resist materials which change in the state for changes in temperature.

Generally, as the formation method of the inorganic heat reaction type resist, it is suitable to provide by the physical thin film formation method such as resistance heating evaporation method, magnetron RF sputtering method, electron beam sputtering method and CVD method. These methods are basically vacuum processes and more steps are needed to be formed on the sleeve than coating method, but it is possible to precisely control the film thickness, and besides, it is easy to laminate the resist layer and the etching layer as plural layers. However, although the absolute value of the film thickness fluctuation can be extremely lower in comparison with the coating methods such as roll coater method, but there may be a case wherein the change of the reflectance for the film thickness fluctuation increases since many materials have high refractive index n and extinction coefficient k. The transferring mold according to the present embodiment is very effective for such a case.

Figure 11:
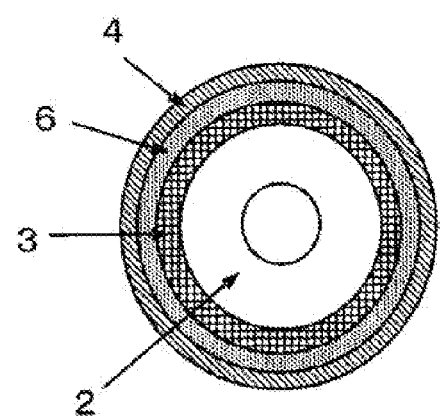
FIG. 11 is a drawing illustrating a sectional structure of the roll body in which an etching layer is provided under the resist layer according to an embodiment of the present invention.
Figure 12:
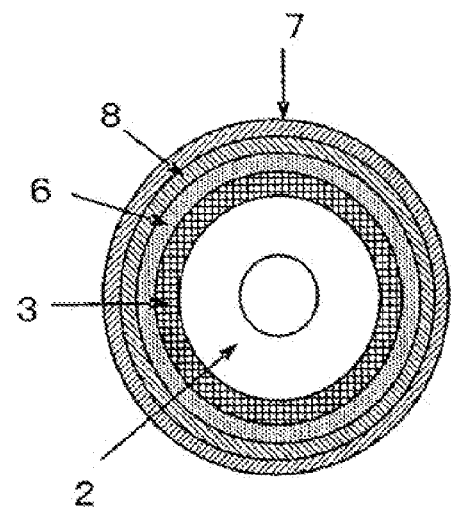
FIG. 12 is a drawing illustrating a sectional structure of the roll body of a construction in which the resist layer according to the present invention is divided into two layers.

In a transferring mold according to the present invention, the fine structure layer may take a construction composed of at least two layers of heat reaction type resist materials. When this desires to form the pattern in which not only a width direction but the depth made fine structure deep, having made it into the lamination structure which formed the etching layer 6 of the lower layer of the heat reaction type resist layer 4 as shown in FIG. 11 is easy to form fine structure rather than using a heat reaction type resist material independently. In this case, the groove depth of the lower etching layer 6 can be deepened the lower etching layer 6 by dry etching. If this construction is used, since the heat reaction type resist layer 4 functions as a mask while it is dry etched, it will be demanded to have a higher dry etching resistance as compared with the etching layer 6. When the heat reaction type resist layer 4 is made to function as a mask in this way, it is possible to adopt a two-layer structure of a resist layer 7 having a dry etching resistance and a resist layer 8 which defines the width of the fine structure in order to further enhance the dry etching resistance. A construction example in which the resist layer is composed of two layers is shown in FIG. 12. In this drawing, a surface layer 3 is formed on the outer peripheral surface of the sleeve 2. And it is constructed to laminate an etching layer 6, a resist layer 8, a resist layer 7 in this order on the surface layer 3.

The etching layer to form a fine structure according to the present invention is suitably composed of a material selected from a group consisting of Si and Ta and the oxides, nitrides and carbides thereof.

For materials to use for etching layer 6 in the present invention, preferred are semiconducting materials such as Si, poly-silicon, GaAs and InP, metals such as Al, Cu, W Ti and Ta and the oxides, nitrides, carbides and alloys thereof, insulators such as $SiO_2$, $Si_3N_4$ and glass, silicide materials such as $WSi_2$, $TiS_2$ and $CoSi_2$, and organic materials such as polyfruoroethylene and PMMA (polymethyl methacrylate), PC (polycarbonate) and so on are suitable to acquire etching anisotropy. Among all, materials selected from a group consisting of Si, Ta and the oxides, nitrides, carbides thereof are preferable, and particularly, semiconductors and insulators such as $SiO_2$, Si, $Si_3N_4$ and $Ta_2O_5$ are more preferable.

Figure 13:
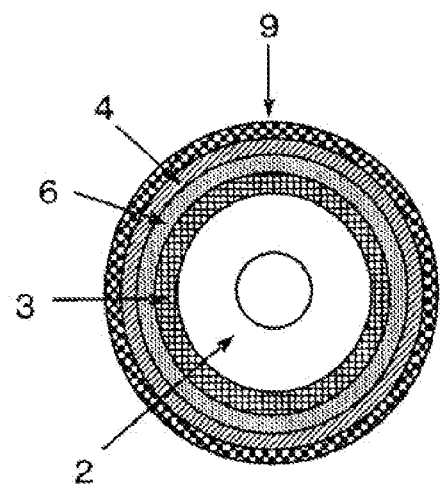
FIG. 13 is a drawing illustrating a sectional structure of the roll body in which a heat-absorbing layer is provided on the resist layer according to an embodiment of the present invention.
Figure 14:
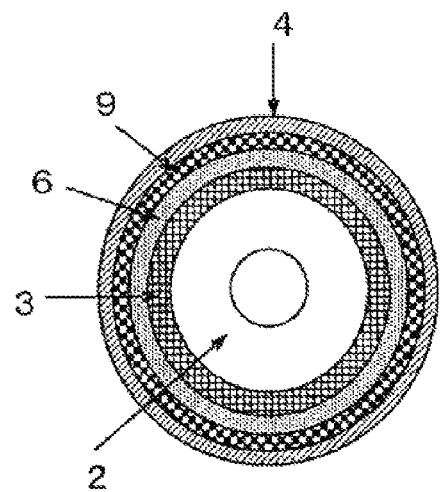
FIG. 14 is a drawing illustrating sectional structure of the roll body in which a heat-absorbing layer is provided under the resist layer according to an embodiment of the present invention.

A heat absorption layer 9 may be provided on the upper side or the lower side of the layer composed of the heat reaction type resist material according to the present invention. A construction in which this absorption layer 9 is provided on the upper side of the heat reaction type resist material is shown in FIG. 13 and a construction in which this absorption layer 9 is provided on the lower side of the heat reaction type resist material is shown in FIG. 14. In FIG. 13, an etching layer 6, a resist layer 4, a heat absorption layer 9 are laminated in this order on the surface layer 3, and, in FIG. 14, an etching layer 6, a heat absorption layer 9, a resist layer 4 are laminated in this order on the surface layer 3.

The role of the heat absorption layer 9 is to enlarge the selection area of absorption characteristics of the light in the heat reaction type resist. As for the heat reaction type resist, many materials have an absorption in a wide range of wavelength, but there is no optical absorption at the wavelength of the laser, for example, at around 405 nm depending on materials. In that case, the heat absorption layer 9 absorbs the energy of the laser and converts it to heat and thus allow the heat reaction type resist to react. For materials to use for heat absorption layer 9 in the present embodiment, materials having absorbing characteristics in the wavelength band of the laser are suitable, and, for example, C, Mg, Al, Si, Ti, V, Cr, Mn, Fe, Co, Ni, Cu, Zn, Ge, Se, Zr, Nb, Mo, Pd, Ag, In, Sn, Sb, Te, Hf, Ta, W, Pt, Au, Pb, Bi and the alloys thereof can be mentioned, and the oxides, nitrides, sulfides, carbides composed of these elements or the mixture thereof may be used. Since there are many materials having high refractive index n and extinction coefficient k in these materials, there is a case wherein the change of the reflectance for the film thickness fluctuation of the heat absorption layer 9 increases. The transferring mold according to the present embodiment is very effective for such a case.

Figure 20:
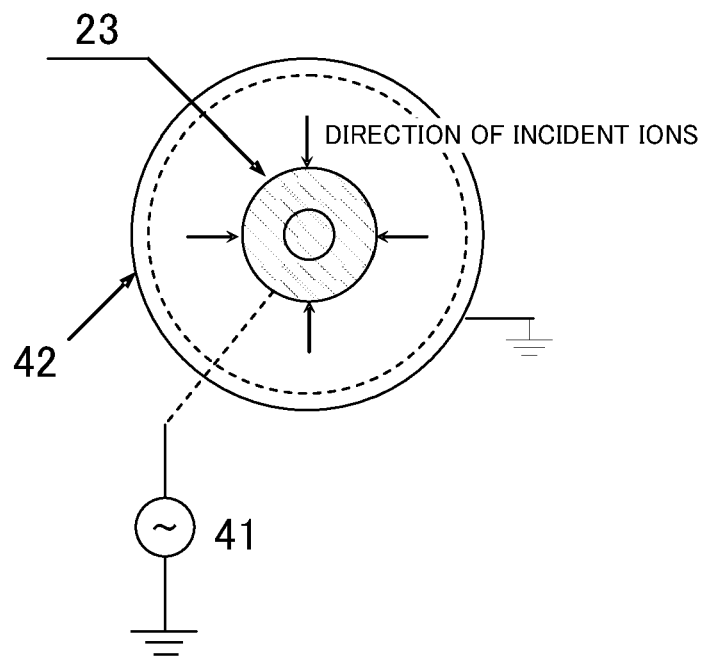
FIG. 20 is a drawing illustrating the direction of ions incident on the roll body when dry etching the roll body according to a working example of the present invention.

The roll body according to the present invention has a construction in which a groove depth of the etching layer 6 can be deepened by dry etching treatment. A method to perform dry etching, a method of directly imparting high frequency 41 on the roll body 23 is preferable from the viewpoint of etching direction and mechanism of the equipment constructed. For deepening the groove depth formed on the roll surface, etching in the direction toward the center axis of the roll body, that is, in the vertical direction to the roll surface is typically demanded. For that purpose, a cylindrical electrode 42 is provided around the roll body 23, and an electric field is formed in the vertical direction to the roll surface by passing an electric current to the roll body directly by high frequency 41 as shown in FIG. 20. Thus the etching layer 6 will be etched toward the surface of the roll body in the vertical direction. In the above method, complicated mechanism to rotate the roll body during dry etching while maintaining vacuum and to apply a high frequency becomes needless, and component construction of the dry etching apparatus becomes very simple and easy.

It becomes essential to have electric conductivity in the roll body namely between the shafts of the both ends in order to directly apply the high frequency 41 to the roll body 23. In other words, if the roll body does not have electric conductivity, it becomes in an electrically insulated state, it is impossible to pass the electric current and therefore, it is not possible to perform etching in the above-mentioned dry etching apparatus.

It is difficult to clearly define whether the roll body does have or does not have electric conductivity due to the necessity of consideration of the applied voltage and wiring resistance of the cables but generally the electric conductivity is typically expressed by electrical resistivity. The materials constituting the roll body having electric conductivity according to the present invention, namely the shaft and the sleeve, preferably have an electrical resistivity of not more than $10^{10}$ Ω·cm and not less than $1.5 \times 10^{-6}$ Ω·cm, more preferably not more than $10^7$ Ω·cm and not less than $2.0 \times 10^{-6}$ Ω·cm. Linear expansion coefficient and electrical resistivity of the materials are shown in following Table 1.

TABLE 1

| | Linear expansion coefficient $\times 10^{-6}$/° C. | Electrical resistivity Ω·cm |
|---|---|---|
| Al | 23.1 | $2.7 \times 10^{-6}$ |
| Ag | 18.9 | $1.59 \times 10^{-6}$ |
| Au | 14.2 | $2.35 \times 10^{-6}$ |
| Fe | 6.5 | $9.71 \times 10^{-6}$ |
| Ti | 11 | $42 \times 10^{-6}$ |
| Carbon steel | 10.6~12.6 | $10~20 \times 10^{-6}$ |
| SUS304 | 17.3 | $73 \times 10^{-6}$ |
| Carbon fiber composite | 0~30 | $2.0 \times 10^{-6}~10^{12}$ |
| 7059 Glass | 4.6 | $~10^{14}$ |
| Quartz glass | 0.5 | $~10^{18}$ |

As the materials constituting the roll body having electric conductivity according to the present invention which can be dry etched are not limited as far as basically they satisfy the definition of the electric conductivity as mentioned above, and metallic materials including Ag, Au, Al, Mg, Fe, Ti or the alloys thereof, SUS, carbon steels, composite materials in which silicon carbide fiber, carbon fiber or metal fiber and the like are impregnated in an epoxy resin and the like or high molecular materials having electric conductivity, for example, electroconductive plastics are applicable.

In the meantime, the roll body according to the present invention should be composed of a material having strength to some extent to be used as a transferring mold since a fragile material such as inorganic materials and glass materials is used or a soft material such as plastics is used for the surface layer. In addition, it is preferable to be materials good at workability when a precise roll body is prepared. It is also necessary for the roll body to have electric conductivity to allow dry etching as mentioned above. In addition, when availability, cost and so on are taken into consideration, it is preferable that materials constituting the roll body satisfying these conditions are composed of either of SUS, carbon steels, Al or Al alloys, Ti or Ti alloys, carbon fiber composites, conductive plastic materials or the combinations of these. Furthermore, Al or Al alloys, Ti or Ti alloys, carbon fiber composites are preferable from the viewpoint of weight saving and bending strength of the roll body and SUS, carbon steels, Al, Ti are more preferable from the viewpoint of workability of the roll body. In addition, plating and the like can be made on the surface of the roll body materials mentioned above to reduce surface roughness. It is more preferable that the plating is to plate a material of small reflectance. Furthermore, light amount fluctuation due the reflection of the roll body surface at the time of exposure is considerably reduced by providing a surface layer according to the present invention but a carbon fiber composite having a property to absorb light is more preferable from the viewpoint of further decreasing it.

Since the roll body is composed of a cylindrical sleeve (roll surface) and a shaft, the roll body may be a combination of the above materials, such as a combination of a sleeve made of a carbon fiber composite and a shaft made of SUS.

When the transferring mold according to the present invention is produced, there may be a case wherein it is necessary to heat the mold to a temperature more than room temperature in the manufacturing process thereof. In that case, if there is a difference between the thermal linear expansion coefficients respective of a sleeve material and a surface layer material, stress will be caused by the difference in the thermal expansion coefficients between the sleeve and the surface layer when the mold is cooled from a high temperature state to a low temperature state. This stress increases theoretically when a difference of the thermal expansion coefficient of sleeve material and surface layer material becomes larger, and detachment of the surface layer from the sleeve and besides destruction of the sleeve or the surface layer may be caused by the stress when unapt materials are selected.

The present inventors examined the problem mentioned above and as a result the inventors found that detachment or destruction could be prevented if the difference in thermal expansion coefficient between the sleeve material and the surface layer material is not less than 0 and not more than $20 \times 10^{-6}$/° C. When a high temperature or more fragile surface layer materials are to be used, it is preferably not more than $15 \times 10^{-6}$/° C., more preferably not more than $10 \times 10^{-6}$/° C., most preferably 0/° C.

When surface layer materials composed of inorganic materials according to the present invention are used, generally many of transparent inorganic materials, for example, borosilicate glass, quartz glass or the like have small linear expansion coefficient. When such materials are used, it is preferable to use sleeve materials in themselves having a thermal linear expansion coefficient of not more than $15 \times 10^{-6}$/° C., for example, Ti and Ti alloys or carbon fiber composites.

Besides, it is more preferable to be not more than $10 \times 10^{-6}$/° C. Particularly, carbon fiber composites are preferable materials as a sleeve since the thermal expansion coefficient can be controlled in the wide range such as 0/° C. to $20 \times 10^{-6}$/° C. by controlling compounding ratio with a resin and direction of the fibers.

As a production process of the transferring mold according to the present invention, there is a method of performing a step of forming a uniform layer composed of a resist material on the roll body, a step of irradiating laser on the layer composed of the resist material to form a fine structure in this order.

The transferring mold manufactured according to the production process mentioned above has an advantage that the method is simplified by directly providing resist on the roll body. However it is a production process effective in the case wherein the depth in the fine structure is relatively small since the resist thickness becomes the depth of the fine structure.

Furthermore, as another production process of the transferring mold of the present invention, a process in which after a step of forming a uniform layer composed of an etching material on the roll body and a step of forming a uniform layer composed of a resist material on the layer composed of the etching material, laser is irradiated on the outer-most surface of the laminated roll body obtained by the above steps to perform patterning on the layer composed of the resist material and subsequently perform etching and further remove the layer composed of the patterned resist material may be adopted.

Although the production process mentioned above provides an etching layer between the resist layer and roll body and thus the process is elongated by a few step but has an advantage to be able to freely control the depth of the fine structure depending on the thickness of the etching layer.

One may select either method in accordance with the depth and shape of the fine structure to be aimed at. Here, both of heat reaction type resist materials and photo resist materials can be used for resist materials in either method depending on the purpose.

Figure 15:
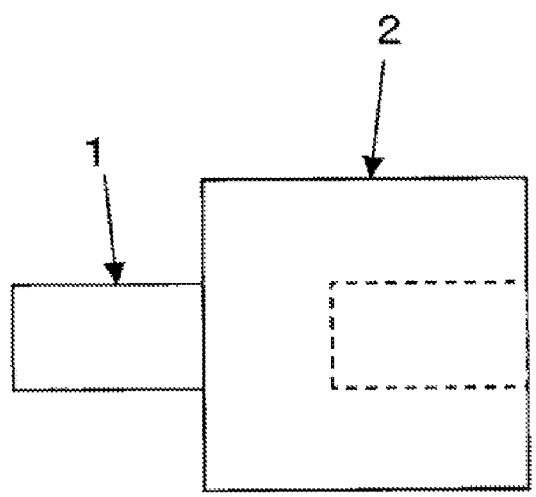
FIG. 15 is a drawing illustrating an embodiment in which a shaft is provided on one side of the roll body according to an embodiment of the present invention.

Various embodiments of the transferring mold according to the present invention can be adopted. For example, there are an embodiment having a shaft 1 only on one side of the both ends of sleeve 2 and an embodiment in which a shaft 1 is inserted and fitted in the opposite side of the shaft 1 as shown in FIG. 15.

Figure 16:
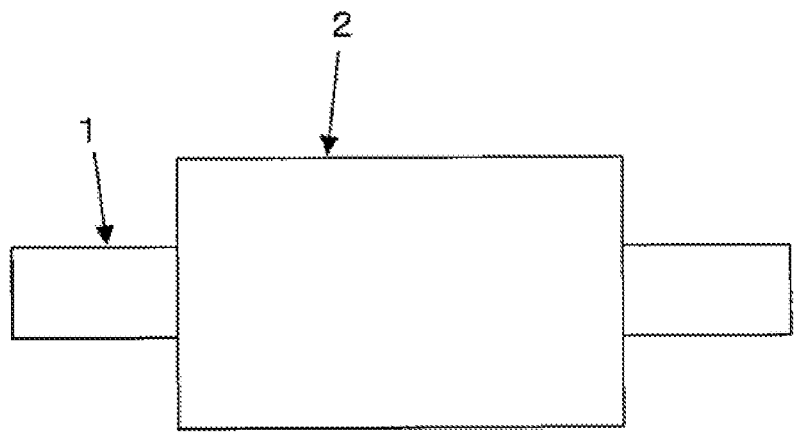
FIG. 16 is a drawing illustrating an embodiment in which shafts are provided on the both sides of the roll body according to an embodiment of the present invention.
Figure 17:
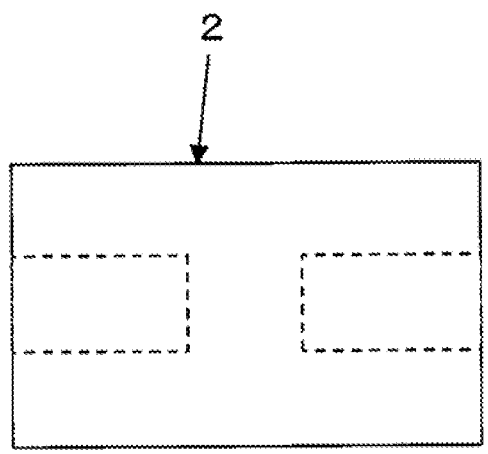
FIG. 17 is a drawing illustrating an embodiment without a shaft and to be fit from the outside in the roll body according to an embodiment of the present invention.
Figure 18:
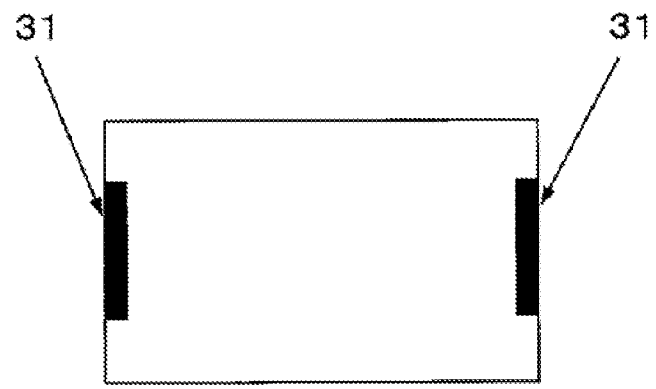
FIG. 18 is a drawing illustrating an embodiment without a shaft and to be held by a magnet or so from the outside in the roll body according to an embodiment of the present invention.

In addition, there is an embodiment having shafts 1 on both sides of the sleeve 2 as shown in FIG. 16 and there is also an embodiment having a shaft 1 fitted and inserted on both sides of the sleeve 2 as shown in FIG. 17. In addition, an embodiment not using the shaft 1 and holding the sleeve with a magnet 31 or the like as shown in FIG. 18 may be adopted.

In the following, working examples performed to make clear the effects of the present invention are described.

Example 1

A cylindrical glass (Shot Company glass code Type: 518635, refractive index n=1.530, extinction coefficient k=0.000) having a thickness of 5 mm was put and fixed on a sleeve of SUS304 which was 50 mm in length and 70 mm in diameter via an electroconductive epoxy resin. A shaft of 50 mm in length and 30 mm in diameter was attached to one edge face of the sleeve so as to align the central line of the sleeve mentioned above.

A heat reaction type resist layer composed of CuO was deposited to 20 nm by sputtering method while turning a roll composed of the sleeve and the shaft mentioned above. At this time, the motor which turned the roll was set with the center axis thereof tilted from the center axis of the roll so that film thickness irregularities were intentionally caused. As a result, the film thickness had a distribution of 20 nm±10%.

The roll surface was focused and a laser beam was irradiated while the roll mentioned above was turned with an exposure apparatus as shown in FIG. 10 and reflectance distribution per one rotation of the above roll was measured. A laser beam was used as a light source 25 and the roll surface was focused and a laser beam was irradiated while the roll body was turned with a spindle motor 26 to measure the reflectance distribution per one rotation of the above roll. The laser used was a semiconductor laser of wavelength of 405 nm and the measurement was performed. Highly precise X stage was installed in parallel with the roll axis mentioned above. The semiconductor laser processing head was fixed on the highly precise X stage. The object lens 24 of the semiconductor laser processing head had a spot size of about 430 nm at N.A.=0.85. The laser beam irradiated on the roll mentioned above was reflected by the roll surface and then measured as a voltage reading in the light receiving part. The measured voltage reading was converted into reflectance using a conversion table.

The reflectance in one turn of the roll having a resist film thickness distribution of 20 nm±10% was measured, and it was confirmed that the minimum value was 22.8% whereas the maximum value was 25.7% and thus the difference therebetween was very small as low as 2.9%.

Example 2

A cylindrical glass (Shot Company glass code Type: 518635, refractive index n=1.530, extinction coefficient k=0.000) having a thickness of 5 mm was put and fixed on a sleeve of SUS304 which was 50 mm in length and 70 mm in diameter via an electroconductive epoxy resin. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused.

As a result, the film thickness had a distribution of 300 nm±30%. A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having an etching layer film thickness distribution of 300 nm±30% was measured, and it was confirmed that the minimum value was 23.3% whereas the maximum value was 25.0% and thus the difference therebetween was very small as low as 1.7%.

Example 3

A cylindrical glass (Shot Company glass code Type: 518635, refractive index n=1.530, extinction coefficient k=0.000) having a thickness of 5 mm was put and fixed on a sleeve of SUS304 which was 50 mm in length and 70 mm in diameter via an electroconductive epoxy resin. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused.

As a result, the film thickness had a distribution of 300 nm±25%. A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and exposure on the above roll was tried. As for the wavelengths of the laser beam and so on, the same conditions as in Example 1 were used.

The number of revolutions of the roll at the time of exposure to a heat reaction type resist was 1670 rpm (linear velocity: 7 m/sec.).
While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer.
As for the formed grooves, the shape of the grooves was transferred onto a PET film using a UV resin. The formed groove width was measured with an atomic force microscope (AFM) and it was confirmed that the groove width had very small variation as low as 150 nm±1% and that uniform exposure was achieved.

Example 4

A cylindrical glass (Shot Company glass code Type: 434950, refractive index n=1.442, extinction coefficient k=0.000) having a thickness of 5 mm was put and fixed on a sleeve of SUS304 which was 50 mm in length and 70 mm in diameter via an electroconductive epoxy resin. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused.
As a result, the film thickness had a distribution of 300 nm±25%. A heat reaction type resist layer composed of CuO was deposited to 20 nm further on that.
At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having an etching layer film thickness distribution of 300 nm±30% was measured, and it was confirmed that the minimum value was 23.5% whereas the maximum value was 24.9% and thus the difference therebetween was very small as low as 1.4%

The number of revolutions of the roll at the time of exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer. As for the formed grooves, the shape of the grooves was transferred onto a PET film using a UV resin. The formed groove width was measured with an AFM and it was confirmed that the groove width had very small variation as low as 150 nm±0.9% and that uniform exposure was achieved.

Example 5

A cylindrical glass (Shot Company glass code Type: 592683, refractive index n=1.607, extinction coefficient k=0.000) having a thickness of 5 mm was put and fixed on a sleeve of SUS304 which was 50 mm in length and 70 mm in diameter via an electroconductive epoxy resin. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused. As a result, the film thickness had a distribution of 300 nm±25%.
A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having an etching layer film thickness distribution of 300 nm±30% was measured, and it was confirmed that the minimum value was 22.4% whereas the maximum value was 26.1% and thus the difference therebetween was very small as low as 3.7%.

The number of revolutions of the roll at the time of exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer. As for the formed grooves, the shape of the grooves was transferred onto a PET film using a UV resin. The formed groove width was measured with an AFM and it was confirmed that the groove width had very small variation as low as 150 nm±2.2% and that uniform exposure was achieved.

Example 6

A cylindrical glass (Shot Company glass code Type: 723292, refractive index n=1.768, extinction coefficient k=0.000) having a thickness of 5 mm was put and fixed on a sleeve of SUS304 which was 50 mm in length and 70 mm in diameter via an electroconductive epoxy resin. A shaft of 50 mm in length and 30 mm in diameter was attached to one edge face of the sleeve so as to align the central line of the sleeve mentioned above.

An etching layer composed of $SiO_2$ was deposited to 300 nm by sputtering above on a roll composed of the sleeve and the shaft mentioned above. At this time, the motor which turned the roll was set with the center axis thereof tilted from the center axis of the roll so that film thickness irregularities were intentionally caused. As a result, the film thickness had a distribution of 300 nm±25%. A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having an etching layer film thickness distribution of 300 nm±30% was measured, and it was confirmed that the minimum value was 20.6% whereas the maximum value was 28.1% and thus the difference therebetween was very small as low as 7.5%

The number of revolutions of the roll at the time of exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer. As for the formed grooves, the shape of the grooves was transferred onto a PET film using a UV resin. The formed groove width was measured with an AFM and it was confirmed that the groove width had very small variation as low as 150 nm±4.5% and that uniform exposure was achieved.

Comparative Example 1

An Al cylinder (refractive index n=0.400, extinction coefficient k=4.450) having a thickness of 5 mm was fitted and fixed on a sleeve of SUS304 which was 50 mm in length and 70 mm in diameter. A shaft of 50 mm in length and 30 mm in diameter was attached to one edge face of the sleeve so as to align the central line of the sleeve mentioned above.

A heat reaction type resist layer composed of CuO was deposited to 20 nm by sputtering method while turning a roll composed of the sleeve and the shaft mentioned above. At this time, the motor which turned the roll was set with the center axis thereof tilted from the center axis of the roll so that film thickness irregularities were intentionally caused. As a result, the film thickness had a distribution of 20 nm±10%.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having a resist film thickness distribution of 20 nm±10% was measured, and it was confirmed that the minimum value was 45.4% whereas the maximum value was 61.2% and thus the difference therebetween was very large as high as 15.8%.

Comparative Example 2

An Al cylinder (refractive index n=0.400, extinction coefficient k=4.450) having a thickness of 5 mm was fitted and fixed on a sleeve of SUS304 which was 50 mm in length and 70 mm in diameter. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above.

At this time, the motor which turned the roll was set with the center axis thereof tilted from the center axis of the roll so that film thickness irregularities were intentionally caused. As a result, the film thickness had a distribution of 300 nm±25%. A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having an etching layer film thickness distribution of 300 nm±25% was measured, and it was confirmed that the minimum value was 6.1% whereas the maximum value was 79.3% and thus the difference therebetween was very large as high as 73.2%

Comparative Example 3

An Al cylinder (refractive index n=0.400, extinction coefficient k=4.450) having a thickness of 5 mm was fitted and fixed on a sleeve of SUS304 which was 50 mm in length and 70 mm in diameter. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused. As a result, the film thickness had a distribution of 300 nm±25%. A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 to try to expose on the roll. The wavelengths of the laser beam and so on were the same as in Example 1.

The number of revolutions of the roll at the time of exposure to a heat reaction type resist was 1670 rpm (linear velocity: 7 m/sec.). While the roll was rotated one turn, the X stage moves 500 nm, and lines with a pitch of 500 nm are exposed consecutively.

Exposure was carried out so that it resulted in lines with a pitch of 500 nm on the roll on which the etching layer and the heat reaction type resist layer mentioned above were formed.

The exposure power was 10.0 mW in the consecutive emission of light. Then, development was performed by dipping it in 0.3 wt % ammonium oxalate solution for around five minutes. Finally, it was washed enough with distilled water and grooves were formed in the heat reaction type resist layer. As for the formed grooves, the shape of the grooves was transferred onto a PET film using a UV resin. The formed groove width was measured with an AFM, the grooves varied continuously from no groove to a groove width of 250 nm and it was confirmed that the variation was very large.

Comparative Example 4

A cylindrical glass (Shot Company glass code Type: 144178, refractive index n=2.273, extinction coefficient k=0.000) having a thickness of 5 mm was put and fixed on a sleeve of SUS304 which was 50 mm in length and 70 mm in diameter via an electroconductive epoxy resin. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused. As a result, the film thickness had a distribution of 300 nm±25%. A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having an etching layer film thickness distribution of 300 nm±25% was measured, and it was confirmed that the minimum value was 16.0% whereas the maximum value was 33.9% and thus the difference therebetween was large as high as 17.9%

The number of revolutions of the roll at the time of exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 9.0 mW in the consecutive emission of light. Then, development was performed by dipping it in 0.3 wt % ammonium oxalate solution for around five minutes. Finally, it was washed enough with distilled water and grooves were formed in the heat reaction type resist layer. As for the formed grooves, the shape of the grooves was transferred onto a PET film using a UV resin. The formed groove width was measured with an AFM, and it was confirmed that the variation was very large as high as 150 nm±10.40 and uneven exposure was performed.

Results of Example 1 to Example 6 and Comparative Example 1 to Comparative Example 4 are shown in Table 2.

TABLE 2

| | Glass type | Refractive index n | Extinction coefficient k | Reflectance fluctuation (%) | Groove width variation (±%) |
|---|---|---|---|---|---|
| Example 1 | 518635 | 1.530 | 0.000 | 2.9 | Not measured |
| Example 2 | 518635 | 1.530 | 0.000 | 1.7 | Not measured |
| Example 3 | 518635 | 1.530 | 0.000 | Not measured | 1 |
| Example 4 | 434950 | 1.442 | 0.000 | 1.4 | 0.9 |
| Example 5 | 592683 | 1.607 | 0.000 | 3.7 | 2.2 |
| Example 6 | 723292 | 1.768 | 0.000 | 7.6 | 4.5 |
| Comparative Example 1 | — | | 0.400 | 4.450 | 15.8 | Not measured |
| Comparative Example 2 | — | | 0.400 | 4.450 | 73.2 | |
| Comparative Example 3 | — | | 0.400 | 4.450 | Not measured | Unmeasurable |
| Comparative Example 4 | 144178 | 2.273 | 0.000 | 17.9 | 10.4 |

Since the transferring mold according to the present embodiment has a surface layer in which a material having a specific optical characteristics is used as shown in Table 2, reflectance fluctuation is reduced and width variation is reduced (Example 1 to Example 6). Since reflectance fluctuation as well as width variation is reduced, it can be understood that the resist layer can be exposed uniformly. On the other hand, it can be understood that when metallic materials were used (Comparative Example 1 to Comparative Example 3) and when glass materials having different refractive indices were used (Comparative Example 4), the reflectance fluctuation increases.

Example 7

A cylindrical glass (Shot Company glass code Type: 518635, refractive index n=1.530, extinction coefficient k=0.000 to which 5% Cu was added in volume fraction) having a thickness of 5 mm was put and fixed on a sleeve of SUS304 which was 50 mm in length and 70 mm in diameter via an electroconductive epoxy resin.

The complex refractive index of this mixture was: refractive index n=1.602, extinction coefficient k=0.133. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above.

At this time, the motor which turned the roll was set with the center axis thereof tilted from the center axis of the roll so that film thickness irregularities were intentionally caused. As a result, the film thickness had a distribution of 300 nm±25%. A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. The wavelengths of the laser beam and so on are the same as in Example 1.

The reflectance in one turn of the roll having an etching layer film thickness distribution of 300 nm±30% was measured, and it was confirmed that the minimum value was 21.7% whereas the maximum value was 26.8% and thus the difference therebetween was very small as low as 5.1%.

The number of revolutions of the roll at the time of exposure to a heat reaction type resist was 1670 rpm (linear velocity: 7 m/sec.). While the roll is rotated one turn, the X stage moves 500 nm, and lines with a pitch of 500 nm are exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer.

As for the formed grooves, the shape of the grooves was transferred onto a PET film using a UV resin. The formed groove width was measured with an AFM and it was confirmed that the groove width had very small variation as low as 150 nm±3% and that uniform exposure was achieved.

Example 8

A cylindrical glass (Shot Company glass code Type: 518635, refractive index n=1.530, extinction coefficient k=0.000 to which 10% Cu was added in volume fraction) having a thickness of 5 mm was put and fixed on a sleeve of SUS304 which was 50 mm in length and 70 mm in diameter via an electroconductive epoxy resin. The complex refractive index of this mixture was: refractive index n=1.669, extinction coefficient k=0.271. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused. As a result, the film thickness had a distribution of 300 nm±25%. A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having an etching layer film thickness distribution of 300 nm±30% was measured, and it was confirmed that the minimum value was 20.0% whereas the maximum value was 28.9% and thus the difference therebetween was very small as low as 8.9%

The number of revolutions of the roll at the time of exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer.

As for the formed grooves, the shape of the grooves was transferred onto a PET film using a UV resin. The formed groove width was measured with an AFM and it was confirmed that the groove width had very small variation as low as 150 nm±5.2% and that uniform exposure was achieved.

Example 9

A cylindrical glass (Shot Company glass code Type: 518635, refractive index n=1.530, extinction coefficient k=0.000 to which 15% Cr was added in volume fraction) having a thickness of 5 mm was put and fixed on a sleeve of SUS304 which was 50 mm in length and 70 mm in diameter via an electroconductive epoxy resin. The complex refractive index of this mixture was: refractive index n=1.993, extinction coefficient k=0.208. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused.

As a result, the film thickness had a distribution of 300 nm±25%. A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having an etching layer film thickness distribution of 300 nm±30% was measured, and it was confirmed that the minimum value was 18.0% whereas the maximum value was 31.3% and thus the difference therebetween was very small as low as 13.3%

The number of revolutions of the roll at the time of exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer. As for the formed grooves, the shape of the grooves was transferred onto a PET film using a UV resin. The formed groove width was measured with an AFM and it was confirmed that the groove width had very small variation as low as 150 nm±7.9% and that uniform exposure was achieved.

Comparative Example 5

A cylindrical glass (Shot Company glass code Type: 518635, refractive index n=1.530, extinction coefficient k=0.000 to which 20% Cu was added in volume fraction) having a thickness of 5 mm was put and fixed on a sleeve of SUS304 which was 50 mm in length and 70 mm in diameter via an electroconductive epoxy resin. The complex refractive index of this mixture was: refractive index n=1.818, extinction coefficient k=0.702. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused. As a result, the film thickness had a distribution of 300 nm±25%. A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having an etching layer film thickness distribution of 300 nm±30% was measured, and it was confirmed that the minimum value was 20.1% whereas the maximum value was 39.5% and thus the difference therebetween was very large as high as 19.4%.

The number of revolutions of the roll at the time of exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer. As for the formed grooves, the shape of the grooves was transferred onto a PET film using a UV resin. The formed groove width was measured with an AFM, and it was confirmed that the variation was very large as high as 150 nm±11.3% and uneven exposure was performed.

Comparative Example 6

A cylindrical glass (Shot Company glass code Type: 518635, refractive index n=1.530, extinction coefficient k=0.000 to which 5% Ag was added in volume fraction) having a thickness of 5 mm was put and fixed on a sleeve of SUS304 which was 50 mm in length and 70 mm in diameter via an electroconductive epoxy resin. The complex refractive index of this mixture was: refractive index n=0.899, extinction coefficient k=0.237. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused. As a result, the film thickness had a distribution of 300 nm±25%. A heat reaction type resist layer composed of CuO was deposited to 20 nm further on that.

At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having an etching layer film thickness distribution of 300 nm±30% was measured, and it was confirmed that the minimum value was 14.6% whereas the maximum value was 36.0% and thus the difference therebetween was large as high as 21.4%

The number of revolutions of the roll at the time of the exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer. As for the formed grooves, the shape of the grooves was transferred onto a PET film using a UV resin. The formed groove width was measured with an AFM, and it was confirmed that the variation was very large as high as 150 nm±12.6% and uneven exposure was performed.

Comparative Example 7

A cylindrical glass (Shot Company glass code Type: 518635, refractive index n=1.530, extinction coefficient k=0.000 to which 10% Ag was added in volume fraction) having a thickness of 5 mm was put and fixed on a sleeve of SUS304 which was 50 mm in length and 70 mm in diameter via an electroconductive epoxy resin. The complex refractive index of this mixture was: refractive index n=0.419, extinction coefficient k=0.674. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused. As a result, the film thickness had a distribution of 300 nm±25%. A heat reaction type resist layer composed of CuO was deposited to 20 nm further on that.

At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. The wavelengths of the laser beam and so on are the same as in Example 1.

The reflectance in one turn of the roll having an etching layer film thickness distribution of 300 nm±30% was measured, and it was confirmed that the minimum value was 4.9% whereas the maximum value was 58.2% and thus the difference therebetween was very large as high as 53.3%.

The number of revolutions of the roll at the time of the exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer. As for the formed grooves, the shape of the grooves was transferred onto a PET film using a UV resin. The formed groove width was measured with an AFM, and it was confirmed that the variation was very large as high as 150 nm±29.9% and uneven exposure was performed.

Comparative Example 8

A cylindrical glass (Shot Company glass code Type: 518635, refractive index n=1.530, extinction coefficient k=0.000 to which 15% Ag was added in volume fraction) having a thickness of 5 mm was put and fixed on a sleeve of SUS304 which was 50 mm in length and 70 mm in diameter via an electroconductive epoxy resin. The complex refractive index of this mixture was: refractive index n=0.290, extinction coefficient k=1.037. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused. As a result, the film thickness had a distribution of 300 nm±25%.

A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having an etching layer film thickness distribution of 300 nm±30% was measured, and it was confirmed that the minimum value was 2.4% whereas the maximum value was 70.1% and thus the difference therebetween was very large as high as 67.7%.

The number of revolutions of the roll at the time of the exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer. As for the formed grooves, the shape of the grooves was transferred onto a PET film using a UV resin. The formed groove width was measured with an AFM, and it was confirmed that the variation was very large as high as 150 nm±36.8% and uneven exposure was performed.

Comparative Example 9

A cylindrical glass (Shot Company glass code Type: 518635, refractive index n=1.530, extinction coefficient k=0.000 to which 25% Cr was added in volume fraction) having a thickness of 5 mm was put and fixed on a sleeve of SUS304 which was 50 mm in length and 70 mm in diameter via an electroconductive epoxy resin. The complex refractive index of this mixture was: refractive index n=2.334, extinction coefficient k=0.407. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused. As a result, the film thickness had a distribution of 300 nm±25%. A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. The wavelengths of the laser beam and so on are the same as in Example 1.

The reflectance in one turn of the roll having an etching layer film thickness distribution of 300 nm±30% was measured, and it was confirmed that the minimum value was 15.0% whereas the maximum value was 35.5% and thus the difference therebetween was large as high as 20.5%.

The number of revolutions of the roll at the time of exposure to a heat reaction type resist was 1670 rpm (linear velocity: 7 m/sec.). While the roll is rotated one turn, the X stage moves 500 nm, and lines with a pitch of 500 nm are exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer. As for the formed grooves, the shape of the grooves was transferred onto a PET film using a UV resin. The formed groove width was measured with an AFM, and it was confirmed that the variation was very large as high as 150 nm±12.1% and uneven exposure was performed.

Results of Example 7 to Example 9 and Comparative Example 5 to Comparative Example 9 are shown in Table 3.

TABLE 3

|  | Glass type | Mixed substance | Addition amount (vos %) | Refractive index n (complex refractive index) | Extinction coefficient k | Reflectance fluctuation (%) | Groove width variation (± %) |
|---|---|---|---|---|---|---|---|
| Example 7 | 518635 | Cu | 5 | 1.602 | 0.133 | 5.1 | 3.0 |
| Example 8 | 518635 | Cu | 10 | 1.669 | 0.271 | 8.9 | 5.2 |
| Example 9 | 518635 | Cr | 15 | 1.993 | 0.208 | 13.4 | 7.9 |
| Comparative Example 5 | 518635 | Cu | 20 | 1.818 | 0.702 | 19.4 | 11.3 |
| Comparative Example 6 | 518635 | Ag | 5 | 0.899 | 0.237 | 21.6 | 12.6 |
| Comparative Example 7 | 518635 | Ag | 10 | 0.419 | 0.674 | 53.8 | 29.9 |
| Comparative Example 8 | 518635 | Ag | 15 | 0.29 | 1.037 | 68.4 | 36.8 |
| Comparative Example 9 | 518635 | Cr | 25 | 2.334 | 0.407 | 20.5 | 12.1 |

As shown in Table 3, when the optical characteristics of the surface layer are within the specified range in the transferring mold according to the present embodiment, both the reflectance fluctuation and the groove width variation can be reduced even if a mixture is contained (Example 7 to Example 9). Meanwhile, it is understood that, if a mixture is contained likewise, when the complex refractive index n and the extinction coefficient k are out of the specified range, the reflectance fluctuation and the groove width variation increase (Comparative Example 5 to Comparative Example 9).

Example 10

A cylindrical glass (quartz glass, refractive index n=1.469664, extinction coefficient k=0.000) having a thickness of 5 mm was put and fixed on a sleeve of SUS304 which was 50 mm in length and 70 mm in diameter via an electroconductive epoxy resin. The complex refractive index of this mixture was: refractive index n=1.993, extinction coefficient k=0.208. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused.

As a result, the film thickness had a distribution of 300 nm±25%. A heat reaction type resist layer composed of CuO was deposited to 20 nm further on that.

At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having an etching layer film thickness distribution of 300 nm±30% was measured, and it was confirmed that the minimum value was 20.4% whereas the maximum value was 20.7% and thus the difference therebetween was very small as low as 0.3%.

The number of revolutions of the roll at the time of the exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer. As for the formed grooves, the shape of the grooves was transferred onto a PET film using a UV resin. The formed groove width was measured with an AFM and it was confirmed that the groove width had very small variation as low as 150 nm±0.13% and that uniform exposure was achieved.

Here, quartz glass was used for the cylindrical glass but when a high silicate glass (Pyrex glass: Corning 7740) was used, the same results were attained.

Example 11

A cylindrical plastic (PMMA, refractive index n=1.490, extinction coefficient k=0.000) having a thickness of 5 mm was put and fixed on a sleeve of SUS304 which was 50 mm in length and 70 mm in diameter via an electroconductive epoxy resin. The complex refractive index of this mixture was: refractive index n=1.993, extinction coefficient k=0.208. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused.

As a result, the film thickness had a distribution of 300 nm±25%. A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having an etching layer film thickness distribution of 300 nm±30% was measured, and it was confirmed that the minimum value was 20.1% whereas the maximum value was 21.0% and thus the difference therebetween was very small as low as 0.9%.

The number of revolutions of the roll at the time of the exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer.
As for the formed grooves, the shape of the grooves was transferred onto a PET film using a UV resin. The formed groove width was measured with an AFM and it was confirmed that the groove width had very small variation as low as 150 nm±0.47% and that uniform exposure was achieved.

Example 12

A cylindrical plastic (PC, refractive index n=1.530, extinction coefficient k=0.000) having a thickness of 5 mm was put and fixed on a sleeve of SUS304 which was 50 mm in length and 70 mm in diameter via an electroconductive epoxy resin. The complex refractive index of this mixture was: refractive index n=1.585, extinction coefficient k=0.000. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. At this time, the motor which turned the roll was set with the center axis thereof tilted from the center axis of the roll so that film thickness irregularities were intentionally caused.
As a result, the film thickness had a distribution of 300 nm±25%. A heat reaction type resist layer composed of CuO was deposited to 20 nm further on that.
At this time, the center axis of the motor and the center axis of the roll were aligned and the film was uniformly formed to a film thickness of 20 nm.

The roll surface was focused and a laser beam was irradiated while the roll mentioned above was turned with an exposure apparatus as shown in FIG. 10 and reflectance distribution per one rotation of the above roll was measured. As for the wavelengths of the laser beam and so on, the same conditions as in Example 1 were used.

The reflectance in one turn of the roll having an etching layer film thickness distribution of 300 nm±30% was measured, and it was confirmed that the minimum value was 18.8% whereas the maximum value was 22.4% and thus the difference therebetween was very small as low as 3.6%.

The number of revolutions of the roll at the time of the exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer.
As for the formed grooves, the shape of the grooves was transferred onto a PET film using a UV resin. The formed groove width was measured with an AFM and it was confirmed that the groove width had very small variation as low as 150 nm±2.0% and that uniform exposure was achieved.

Results of Example 10 to Example 12 are shown in Table 4.

TABLE 4

| | Material | Refractive index n | Extinction coefficient k | Reflectance fluctuation (%) | Groove width variation (±%) |
|---|---|---|---|---|---|
| Example 10 | Quartz glass | 1.469 | 0 | 0.3 | 0.13 |
| Example 11 | PMMA | 1.490 | 0 | 0.9 | 0.47 |
| Example 12 | PC | 1.585 | 0 | 3.6 | 2.0 |

As shown in Table 4, various kinds of glass materials such as quartz glass or the high silicate glass can be used for materials of the surface layer (Example 10).
It is also understood that reflectance fluctuation and groove width variation can be reduced using organic materials (Example 11, Example 12).

Example 13

A cylindrical glass (Shot Company glass code Type: 518635, refractive index n=1.530, extinction coefficient k=0.000) having a thickness of 5 mm was put and fixed on a sleeve of SUS304 which was 50 mm in length and 70 mm in diameter via an electroconductive epoxy resin. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. A heat reaction type resist layer composed of GaSb was deposited to 40 nm further on that. Sputtering conditions were adjusted so that the arithmetic average roughness Ra became 1.8 nm.

The roll surface was focused and a laser beam was irradiated while the roll mentioned above was turned with an exposure apparatus as shown in FIG. 10 and reflectance distribution per one rotation of the above roll was measured. The wavelengths of the laser beam and so on are the same as in Example 1. The number of revolutions of the roll at the time of exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 2.0 mW in the consecutive emission of light. Then, development was performed by dipping it in hydrochloric acid of pH 1 for around 40 minutes. Finally, it was washed enough with distilled water and grooves were formed in the heat reaction type resist layer. As for the formed grooves, the shape of the grooves was transferred onto a PET film using a UV resin.

The formed groove shape was observed with an AFM, and it was confirmed that grooves having approximately the same depth as the heat reaction type resist film thickness were formed.

Comparative Example 10

A cylindrical glass (Shot Company glass code Type: 518635, refractive index n=1.530, extinction coefficient k=0.000) having a thickness of 5 mm was put and fixed on a sleeve of SUS304 which was 50 mm in length and 70 mm in diameter via an electroconductive epoxy resin. A shaft of 50 mm in length and 30 mm in diameter was attached to one edge face of the sleeve so as to align the central line of the sleeve mentioned above.

An etching layer composed of $SiO_2$ was deposited to 300 nm by sputtering method on a roll composed of the sleeve and the shaft mentioned above. A heat reaction type resist layer composed of GaSb was deposited to 40 nm further on that. Since the roll was prepared by a technique wherein polishing was not performed after grinding the glass surface, the arithmetic average roughness Ra was 15 nm.

The roll surface was focused and a laser beam was irradiated while the roll mentioned above was turned with an exposure apparatus as shown in FIG. 10 and reflectance distribution per one rotation of the above roll was measured. The wavelengths of the laser beam and so on are the same as in Example 1. The number of revolutions of the roll at the time of the exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 2.0 mW in the consecutive emission of light. Then, development was performed by dipping it in hydrochloric acid of pH 1 for around 40 minutes. Finally, it was washed enough with distilled water and grooves were formed in the heat reaction type resist layer. As for the formed grooves, the shape of the grooves was transferred onto a PET film using a UV resin. The formed groove shape was observed with an AFM, but clear groove shape was not able to be confirmed.

As shown in Example 13, when arithmetic average roughness Ra of the surface layer is low, there is no influence on exposure performance and high exposure performance develops. On the other hand as shown in Comparative Example 11, it can be understood that exposure performance deteriorates when arithmetic average roughness Ra is high.

Example 14

A cylindrical glass (quartz glass, refractive index n=1.469664, extinction coefficient k=0.000) having a thickness of 3 mm was put and fixed on a sleeve of a carbon composite which was 200 mm in length and 70 mm in diameter via an electroconductive epoxy resin. The complex refractive index of this mixture was: refractive index n=1.993, extinction coefficient k=0.208. SUS shafts of 50 mm in length and 30 mm in diameter were attached to the both edge faces of the sleeve so as to align the central line of the sleeve mentioned above. The volume resistance of the carbon composite used for the sleeve was 2Ω·cm and it was confirmed that there was good conduction by applying a tester to the both ends of the shaft for measuring the electric conductivity.

An etching layer composed of $SiO_2$ was deposited to 300 nm by sputtering method on a roll composed of the sleeve and the shaft mentioned above. At this time, the center axis of the motor which turned the roll and the center axis of the roll were aligned and the film was uniformly formed to a film thickness of 300 nm. A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated and the roll mentioned above was exposed while the roll was turned with an exposure apparatus as shown in FIG. 10. As for the wavelengths of the laser beam and so on, the same conditions as in Example 1 were used.

The number of revolutions of the roll at the time of exposure to a heat reaction type resist was 1670 rpm (linear velocity: 7 m/sec.). While the roll was rotated one turn, the X stage moved 500 nm, and lines with a pitch of 500 nm were exposed consecutively.

Figure 19:
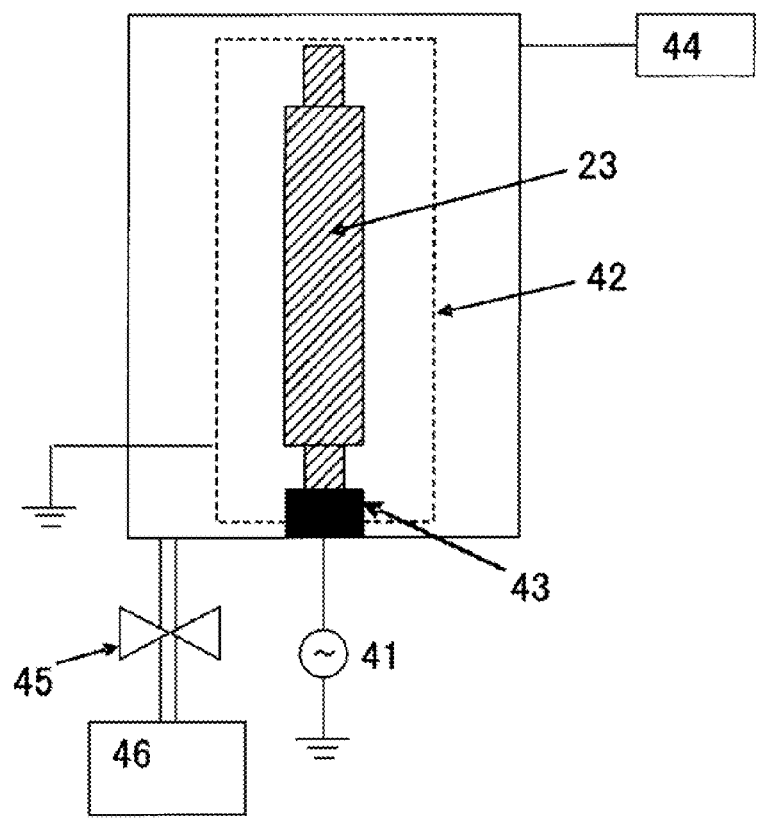
FIG. 19 is a drawing illustrating an apparatus for dry etching the roll body according to a working example of the present invention.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer. Etching was performed for the region where grooves were formed with a dry etching apparatus shown in FIG. 19 using, as a mask, the resist material of the part where grooves were not formed. Dry etching conditions: $CH_4$ gas 44 was used and etching gas-pressure was 5 Pa, and etching was performed at a frequency of 13.56 MHz and an etching power of 300 W for ten minutes. After etching, groove shape was transferred to a PET film with a UV resin. The formed groove width and depth were observed with an AFM, and it was confirmed that rectangular shape of grooves having a groove width of 150 nm and a groove depth of 300 nm was formed.

Comparative Example 11

Figure 21:
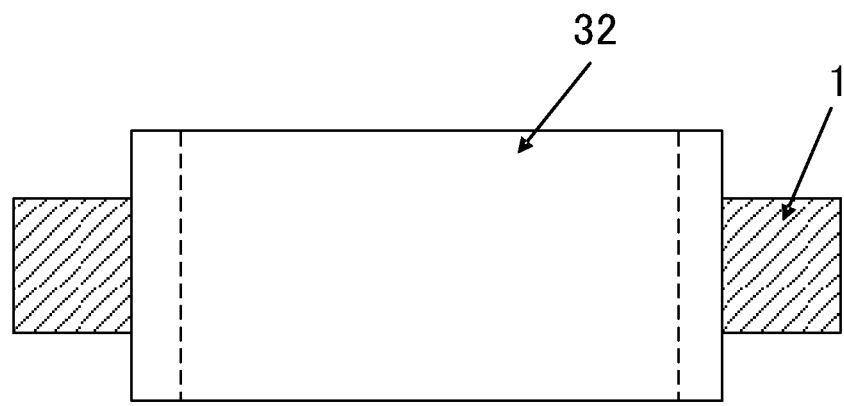
FIG. 21 is a drawing illustrating an embodiment in which a shaft is directly attached to the glass sleeve of the roll body according to a working example of the present invention.

A cylindrical glass (quartz glass, refractive index n=1.469664, extinction coefficient k=0.000) which was 200 mm in length, 80 mm in diameter (thickness 10 mm) was prepared. SUS shaft 1 which was 50 mm in length and 30 mm in diameter attached to the both edge faces of the glass sleeve 32 by fixing them to the inner diameter of the glass with an epoxy adhesive so that they aligned to the central line of the sleeve mentioned above (FIG. 21). It was confirmed that there was no conduction by applying a tester to the both ends of the shaft for measuring the electric conductivity.

An etching layer composed of $SiO_2$ was deposited to 300 nm by sputtering method on a roll composed of the sleeve and the shaft mentioned above. At this time, the center axis of the motor which turned the roll and the center axis of the roll were aligned and the film was uniformly formed to a film thickness of 300 nm. A heat reaction type resist layer composed of CuO was deposited to 20 nm further on that. At this time, the center axis of the motor and the center axis of the roll were aligned and the film was uniformly formed to a film thickness of 20 nm.

The roll surface was focused and a laser beam was irradiated and the roll was exposed while the roll was turned with an exposure apparatus as shown in FIG. 10. As for the wavelengths of the laser beam and so on, the same conditions as in Example 1 were used.

The number of revolutions of the roll at the time of the exposure to a heat reaction type resist was 1670 rpm (linear velocity: 7 m/sec.). While the roll was rotated one turn, the X stage moved 500 nm, and lines with a pitch of 500 nm were exposed consecutively.

Consecutive exposure of lines with a pitch of 500 nm was carried out on the roll on which the etching layer and the heat reaction type resist layer mentioned above were formed. The exposure power was 8.0 mW in the consecutive emission of light. Then, development was performed by dipping it in 0.3 wt % ammonium oxalate solution for around five minutes. Finally, it was washed enough with distilled water and grooves were formed in the heat reaction type resist layer. Etching was performed for the region where grooves were formed with a dry etching apparatus shown in FIG. 19 using, as a mask, the resist material of the part where grooves were not formed. Dry etching conditions: $CH_4$ gas 44 was used and etching gas-pressure was 5 Pa, and etching was attempted at a frequency of 13.56 MHz and an etching power of 300 W, but etching was not achieved since electric discharge did not occur at all. After the etching treatment, the roll body was taken out from the dry etching apparatus and the groove depth was measured and it was confirmed that the thickness of the resist was 20 nm and etching was not achieved at all.

Example 15

Two kinds of sleeves were prepared: a sleeve made of a carbon composite (linear expansion coefficient $2 \times 10^{-6}/°C$.) which was 200 mm in length and 70 mm in diameter and a sleeve made of an Al alloy: 5052 (linear expansion coefficient $23.1 \times 10^{-6}/°C$.) of the same shape. A cylindrical glass (quartz glass, refractive index n=1.469664, extinction coefficient k=0.000, thermal expansion coefficient $0.5 \times 10^{-6}/°C$.) having a thickness of 3 mm was put and fixed on the above sleeves respectively via an electroconductive epoxy resin. The complex refractive index of this mixture was: refractive index n=1.993, extinction coefficient k=0.208. SUS shafts of 50 mm in length and 30 mm in diameter were attached to the both edge faces of the sleeve so as to align the central line of the sleeve mentioned above. The volume resistance of the carbon composite used for the sleeve was $2\Omega \cdot cm$ and it was confirmed that there was good conduction by applying a tester to the both ends of the shaft for measuring the electric conductivity.

Two kinds of molds which were prepared as above were allowed to standstill at a temperature of 100° C. for one hour and then taken out to room temperature and allowed to stand still for one day. No change was observed in a mold made of a carbon composite having a small thermal expansion coefficient but quartz glass of the surface layer broke in a sleeve made of an Al alloy and the sleeve was in a condition which could not be used as a transferring mold.

As described above, according to the transferring mold according to the present embodiment, use was made of a roll body having a surface layer in which materials having specific optical characteristics were used, and thereby exposure of the resist layer can be performed well, and thus roll-shaped transferring molds having fine patterns not more than 1 μm on the surface can be realized.

Particularly, these roll-shaped transferring molds are wide in area and excellent in productivity, besides they have high degree of freedom of uneven shape and enable to freely control the aspect ratio of fine structures, and they can be used as master molds for nanoimprints or optical films.

INDUSTRIAL APPLICABILITY

The present invention can be applied to a mold in which a heat reaction type resist and a photo resist and so on are used and can be used for nanoimprints and formation of optical elements.

This application is based on Japanese Patent Application No. 2009-136700 filed on Jun. 5, 2009. The contents thereof are entirely incorporated herein.

The invention claimed is:

1. A transferring mold characterized in that the mold comprises a roll body formed approximately in a column shape, a surface layer formed on the outer peripheral surface of the roll body and a fine structure layer formed on the surface layer and that the surface layer is composed of a material having a refractive index n of not less than 1.3 and not more than 2.0 and an extinction coefficient k of not more than 0.3 at a wavelength of 405 nm.

2. The transferring mold according to claim 1 characterized in that the surface layer is composed of an inorganic material having a refractive index n of not less than 1.3 and not more than 2.0 and an extinction coefficient k of not more than 0.3 at a wavelength of 405 nm.

3. The transferring mold according to claim 2 characterized in that the inorganic material is selected from a group consisting of oxides, nitrides, carbides, sulfides and fluorides of an element of Group I to Group VI and Group XII to Group XVI in the periodic table and a mixture thereof.

4. The transferring mold according to claim 3 characterized in that the inorganic material is a glass material.

5. The transferring mold according to claim 4 characterized in that the glass material is selected from a group consisting of quartz glass, high silica glass, borosilicate glass, amino silica glass, alkali-free glass, flint glass, barium glass, phosphosilicate glass, fluoride glass, lanthanum glass, transparent glass ceramics and heat-absorbing glass.

6. The transferring mold according to claim 1 characterized in that the surface layer is composed of an organic material having a refractive index n of not less than 1.3 and not more than 2.0 and an extinction coefficient k of not more than 0.3 at a wavelength of 405 nm.

7. The transferring mold according to claim 6 characterized in that the organic material is selected from a group consisting of polypropylene, polyester, polyethylene terephthalate, polyethylenenaphthalate, polyphenylene sulfide, polyethersulfone, polyimide, polycarbonate, polymethylene methacrylate, acrylate, polyvinyl alcohol, polyamide, aramid, fluororesin, polyolefin, silicone resin, epoxy resin, amideimide resin, maleimide resin, cellulosic resin, and liquid crystal polymer.

8. The transferring mold according to any one of claim 1 to claim 7 characterized in that the thickness of the surface layer is not less than 5 μm and not more than 10 mm.

9. The transferring mold according to claim 1 characterized in that arithmetic average roughness Ra as a surface roughness of the surface layer is not more than 10 nm.

10. The transferring mold according to claim 1 characterized in that the surface layer is composed of at least two laminated layers of materials having a refractive index n of not less than 1.3 and not more than 2.0 and an extinction coefficient k of not more than 0.3 at a wavelength of 405 nm and that a light-absorbing layer is formed between the roll body and the surface layer in contact with the roll body.

11. The transferring mold according to claim 1 characterized in that the roll body is a roll body having electric conductivity.

12. The transferring mold according to claim 11 characterized in that the roll body is a roll body having electric conductivity composed of a material selected from a group consisting of SUS, carbon steel, Al, Al alloy, Ti, Ti alloy, carbon fiber composite, electrically conductive plastic material and these combinations.

13. The transferring mold according to claim 11 characterized in that the roll body has an electric conductivity composed of a material having an electrical resistivity of not more than $10^{10}$ Ω·cm.

14. The transferring mold according to claim 1 characterized in that the difference of the thermal linear expansion coefficient at room temperature between the roll body and the surface layer formed on the outer peripheral surface of the roll body is not more than $20 \times 10^{-6}$/° C.

15. The transferring mold according to claim 14 characterized in that the roll body is composed of a material having a thermal linear expansion coefficient of not more than $15 \times 10^{-6}$/° C.

16. The transferring mold according to claim 1 characterized in that the fine structure layer is composed of a photo resist material.

17. The transferring mold according to claim 1 characterized in that the fine structure layer is composed of a heat reaction type resist material.

18. The transferring mold according to claim 17 characterized in that the heat reaction type resist material is an organic resist material or an inorganic resist material.

19. The transferring mold according to claim 17 characterized in that the heat reaction type resist materials are selected from a group consisting of incomplete oxides, pyrolytic oxides and metal alloys.

20. The transferring mold according to any one of claim 17 to claim 19 characterized in that the fine structure layer is composed of at least two layers of laminated heat reaction type resist materials.

21. The transferring mold according to claim 1 characterized in that the fine structure layer is composed of a material selected from a group consisting of Si, oxides of Si, nitrides of Si, carbides of Si, Ta, oxides of Ta, nitrides of Ta and carbides of Ta.

22. The transferring mold according to claim 1 characterized in that a heat absorption layer is formed on the upper or lower side of the fine structure layer.

23. A production process of a transferring mold characterized in that the process comprises a step of forming a roll body used for the transferring mold according to claim 16 and a layer composed of a resist material on the surface layer which is formed on the outer peripheral surface of the roll body and a step of forming a fine structure by irradiating laser on the layer composed of a resist material.

24. A production process of the transferring mold characterized in that the process comprises a step of forming a roll body used for the transferring mold according to claim 21 and a layer composed of an etching material selected from a group consisting of Si, oxides of Si, nitrides of Si, carbides of Si, Ta, oxides of Ta, nitrides of Ta and carbides of Ta on the surface layer which is formed on the outer peripheral surface of the roll body, a step of forming a layer composed of a resist material on the layer composed of an etching material, a step of forming a fine structure by irradiating laser on the layer composed of a resist material, a step of etching the layer composed of an etching material and a step of removing the layer composed of a resist material on which the fine structure has been formed.

* * * * *